United States Patent
Yokochi et al.

(10) Patent No.: US 12,183,755 B2
(45) Date of Patent: Dec. 31, 2024

(54) IMAGING DEVICE AND ELECTRONIC APPARATUS

(71) Applicant: SONY SEMICONDUCTOR SOLUTIONS CORPORATION, Kanagawa (JP)

(72) Inventors: Kaito Yokochi, Kanagawa (JP); Takayuki Ogasahara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 510 days.

(21) Appl. No.: 17/420,505

(22) PCT Filed: Jan. 17, 2020

(86) PCT No.: PCT/JP2020/001449
§ 371 (c)(1),
(2) Date: Jul. 2, 2021

(87) PCT Pub. No.: WO2020/158443
PCT Pub. Date: Aug. 6, 2020

(65) Prior Publication Data
US 2022/0085081 A1    Mar. 17, 2022

(30) Foreign Application Priority Data

Jan. 31, 2019  (JP) .................. 2019-015712

(51) Int. Cl.
*H01L 27/146* (2006.01)
*G02B 5/20* (2006.01)

(52) U.S. Cl.
CPC ...... *H01L 27/1463* (2013.01); *H01L 27/1462* (2013.01); *H01L 27/14621* (2013.01);
(Continued)

(58) Field of Classification Search
CPC ............. H01L 27/1463; H01L 27/1462; H01L 27/14621; H01L 27/14645;
(Continued)

(56) References Cited

U.S. PATENT DOCUMENTS 10,236,315 B2* 3/2019 Ooka ................ H01L 27/14685
2006/0158547 A1* 7/2006 Komatsu .......... H01L 27/14621
348/340

(Continued)

FOREIGN PATENT DOCUMENTS

CN  104488082  4/2015
CN  107408568  11/2017
(Continued)

OTHER PUBLICATIONS

International Search Report prepared by the Japan Patent Office on Mar. 12, 2020, for International Application No. PCT/JP2020/001449.
(Continued)

*Primary Examiner* — Marcos D. Pizarro
*Assistant Examiner* — Tiberiu Dan Onuta
(74) *Attorney, Agent, or Firm* — SHERIDAN ROSS P.C.

(57) ABSTRACT

An imaging device and an electronic apparatus that make it possible to reduce color mixture between pixels are provided. An imaging device of an embodiment of the present disclosure includes: a plurality of pixels (PX) each having a stacked structure in which a photoelectric conversion section (PD) including a light entrance surface, a first light transmissive film provided to face the light entrance surface and having a first refractive index ($n_{CF}$), and a second light transmissive film having a second refractive index ($n_{18}$) higher than the first refractive index are stacked in order in a stacking direction, the plurality of pixels being arranged in an in-plane direction orthogonal to the stacking direction;
(Continued)

and a first pixel separation section provided between a plurality of the first light transmissive films adjacent to each other in the in-plane direction, and having a third refractive index ($n_{13}$) lower than the first refractive index.

19 Claims, 27 Drawing Sheets

(52) U.S. Cl.
CPC .. *H01L 27/14645* (2013.01); *H01L 27/14685* (2013.01); *H01L 27/14689* (2013.01); *G02B 5/201* (2013.01)

(58) Field of Classification Search
CPC ......... H01L 27/14685; H01L 27/14689; H01L 27/14623; H01L 31/0232; G02B 5/201; H04N 25/70
See application file for complete search history.

(56) References Cited

U.S. PATENT DOCUMENTS

| | | | |
|---|---|---|---|
| 2010/0177223 A1* | 7/2010 | Rennie | H01L 27/14609 257/438 |
| 2012/0235266 A1 | 9/2012 | Ootsuka | |
| 2015/0187826 A1* | 7/2015 | Suzuki | H04N 23/10 438/70 |
| 2015/0270298 A1* | 9/2015 | Lin | H01L 27/14621 438/70 |
| 2018/0301491 A1 | 10/2018 | Nakamoto et al. | |
| 2018/0350856 A1 | 12/2018 | Masagaki et al. | |

FOREIGN PATENT DOCUMENTS

| | | |
|---|---|---|
| JP | 2013-156463 | 8/2013 |
| JP | 2016-052041 | 4/2016 |
| KR | 20180108414 A | 10/2018 |
| WO | WO 2013/031160 | 3/2013 |
| WO | WO 2014/021115 | 2/2014 |
| WO | WO 2017/073321 | 5/2017 |
| WO | WO 2017/130723 | 8/2017 |

OTHER PUBLICATIONS

Official Action (with English translation) for China Patent Application No. 202080008370.3, dated Aug. 25, 2024, 19 pages.

* cited by examiner

IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2020/001449 having an international filing date of 17 Jan. 2020, which designated the United States, which PCT application claimed the benefit of Japanese Patent Application No. 2019-015712 filed 31 Jan. 2019, the entire disclosures of each of which are incorporated herein by reference.

TECHNICAL FIELD

The present disclosure relates to an imaging device, and an electronic apparatus including the same.

BACKGROUND ART

In an imaging device, a configuration in which color filters are provided on light entrance surfaces of pixels that perform photoelectric conversion has been known (see, for example, PTL 1 and PTL 2). The color filters include, for example, a red filter, a green filter, and a blue filter. Signals corresponding to the respective colors are acquired from the pixels having the filters of the respective colors to thereby capture a color image.

Further, an imaging device in which an on-chip lens is provided on the color filter has been known (see, for example, PTL 2). The on-chip lens increases photoelectric conversion efficiency at a light receiving section by condensing light that enters the light receiving section.

CITATION LIST

Patent Literature

PTL 1: Japanese Unexamined Patent Application Publication No. 2013-156463 PTL 2: Japanese Unexamined Patent Application Publication No. 2016-52041

SUMMARY OF THE INVENTION

Regarding such an imaging device, it is desired to reduce color mixture between pixels. The color mixture between pixels occurs, for example, when entering light that is to enter a certain pixel passes through the color filter of that pixel and enters another pixel that the entering light is not originally intended to enter.

It is desirable to provide an imaging device and an electronic apparatus that make it possible to reduce color mixture between pixels.

An imaging device of an embodiment of the present disclosure includes a plurality of pixels and a first pixel separation section. The plurality of pixels each has a stacked structure in which a photoelectric conversion section including a light entrance surface, a first light transmissive film provided to face the light entrance surface and having a first refractive index, and a second light transmissive film having a second refractive index higher than the first refractive index are stacked in order in a stacking direction. Further, the plurality of pixels is arranged in an in-plane direction orthogonal to the stacking direction. The first pixel separation section is provided between a plurality of the first light transmissive films adjacent to each other in the in-plane direction, and has a third refractive index lower than the first refractive index.

An electronic apparatus according to an embodiment of the present disclosure includes an optical system, an imaging device, and a signal processing circuit. As the imaging device, the electronic apparatus includes the imaging device according to the foregoing embodiment of the present disclosure.

According to the imaging device and the electronic apparatus of the respective embodiments of the present disclosure, even if light obliquely enters a pixel, an angle of the entry into a wall side of the first light transmissive film is made shallow (an entry angle with respect to an interface between the first light transmissive film and an inter-pixel light-blocking section is made large) by the second light transmissive film having a high refractive index, and the light is totally reflected at the interface. As a result, the light having obliquely entered the pixel is hindered from entering any adjacent pixel, and it is thus possible to reduce color mixture between the pixels.

MODES FOR CARRYING OUT THE INVENTION

In the following, description is given in detail of embodiments of the present disclosure with reference to the drawings. It is to be noted that description is given in the following order.

1. Embodiment (Imaging Device) . . . FIGS. 1 to 4

An example including color pixels in Bayer arrangement, with a film having a third refractive index provided in an inter-pixel light-blocking section, the inter-pixel light-blocking section having a width greater than a width of a pixel separation region in a substrate.

2. Modification Examples (Imaging Devices)

Figure 7A:
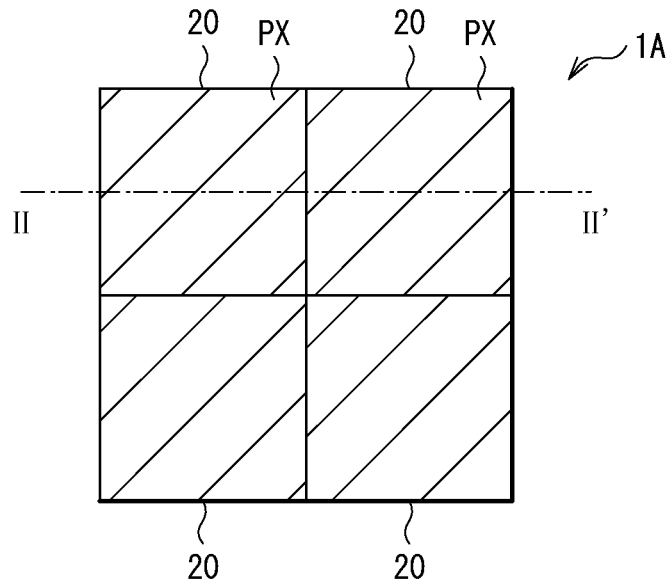
FIG. 7A is a diagram illustrating an example of a planar configuration of an imaging device according to Modification Example A.
Figure 7B:
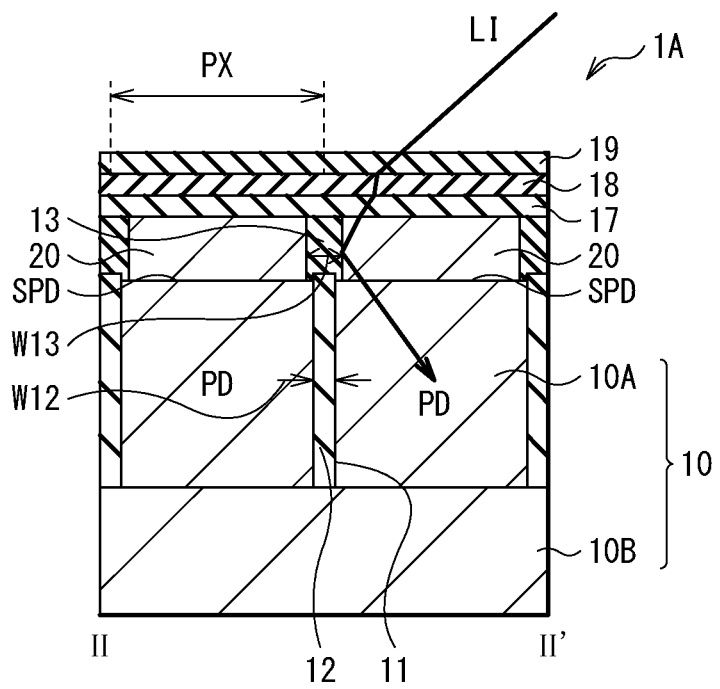
FIG. 7B is a diagram illustrating an example of a cross-sectional configuration of the imaging device of FIG. 7A taken along II-II'.
Figure 8A:
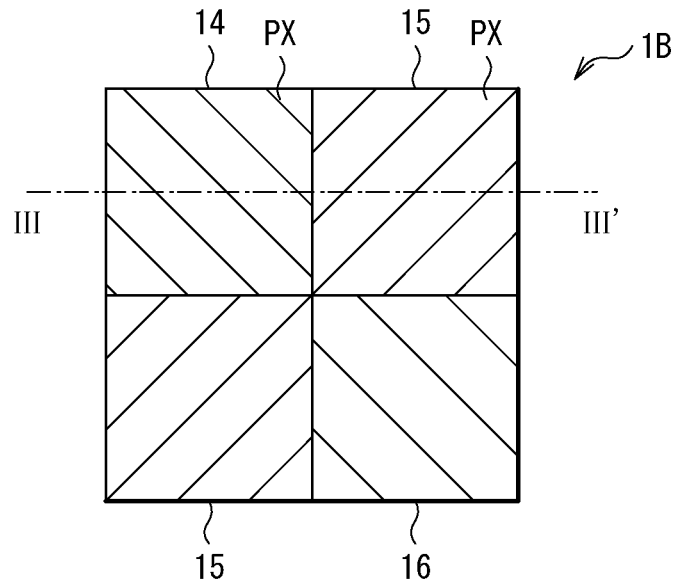
FIG. 8A is a diagram illustrating an example of a planar configuration of an imaging device according to Modification Example B.
Figure 8B:
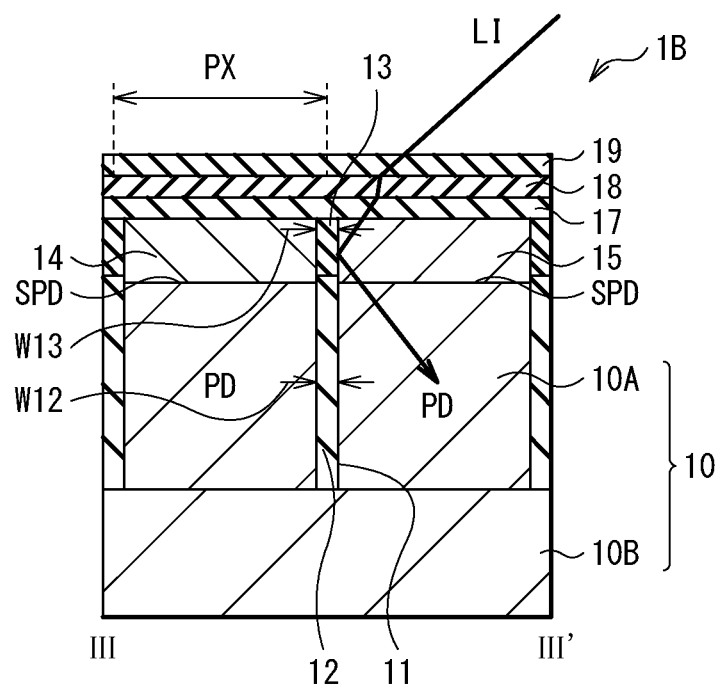
FIG. 8B is a diagram illustrating an example of a cross-sectional configuration of the imaging device of FIG. 8A taken along III-III'.
Figure 9A:
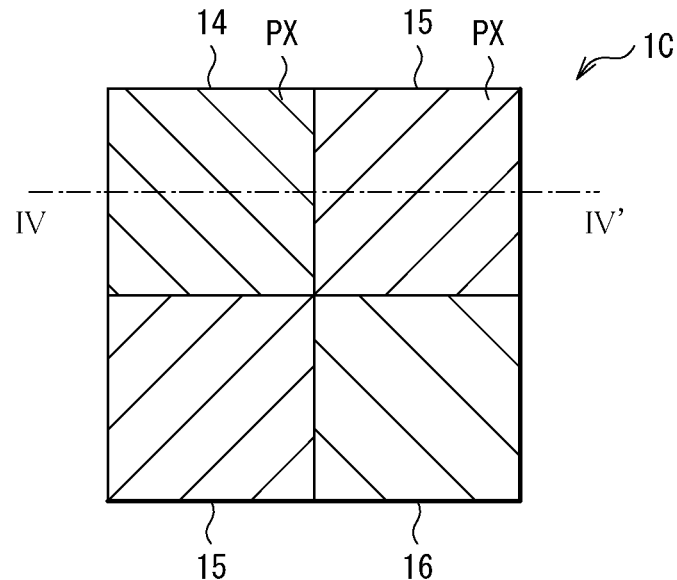
FIG. 9A is a diagram illustrating an example of a planar configuration of an imaging device according to Modification Example C.
Figure 9B:
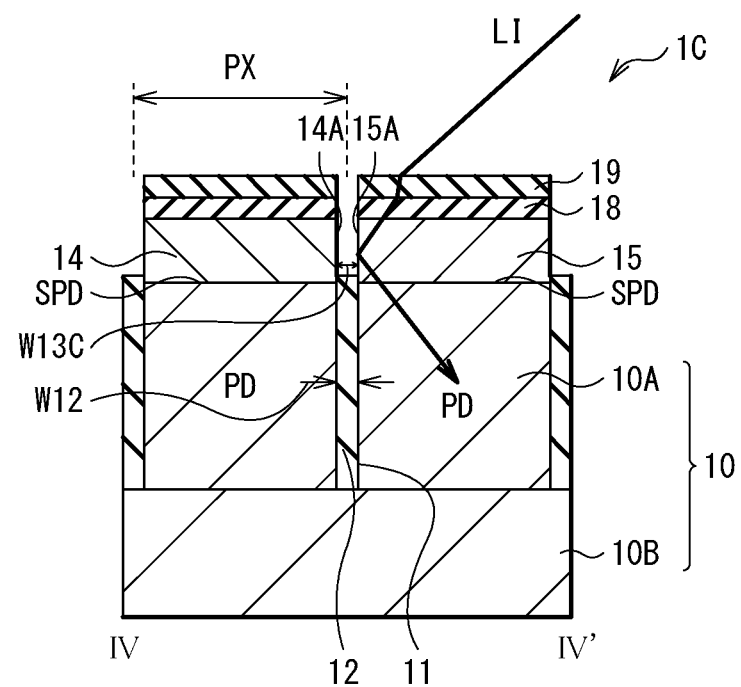
FIG. 9B is a diagram illustrating an example of a cross-sectional configuration of the imaging device of FIG. 9A taken along IV-IV'.
Figure 10:
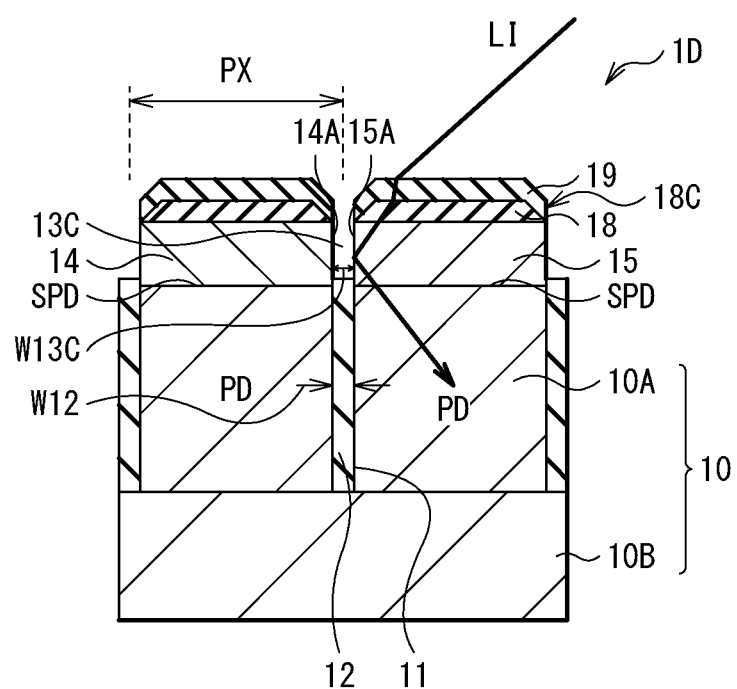
FIG. 10 is a diagram illustrating an example of a cross-sectional configuration of an imaging device according to Modification Example D.

Modification Example A: an example including monochrome pixels . . . FIGS. 7A and 7B Modification Example B: an example in which the width of the inter-pixel light-blocking section is equal to the width of the pixel separation region in the substrate . . . FIGS. 8A and 8B Modification Example C: an example in which air is used for the inter-pixel light-blocking section . . . FIGS. 9A and 9B Modification Example D: an example in which an end part of a color filter has a tapered shape . . . FIG. 10

Figure 11A:
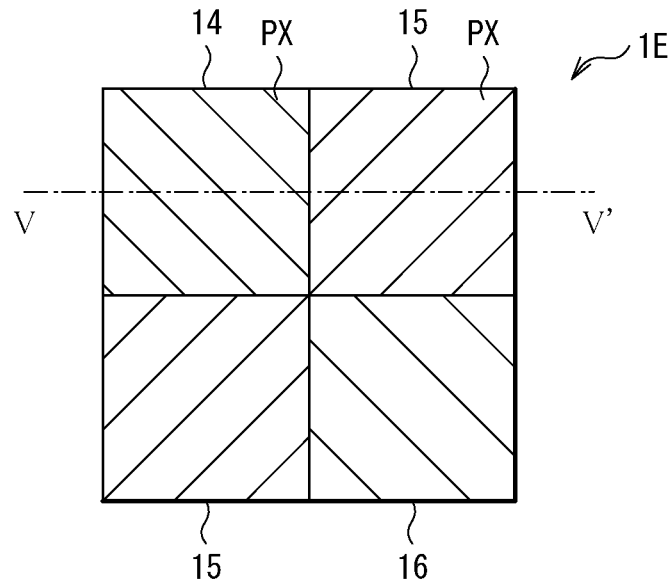
FIG. 11A is a diagram illustrating an example of a planar configuration of an imaging device according to Modification Example E.
Figure 11B:
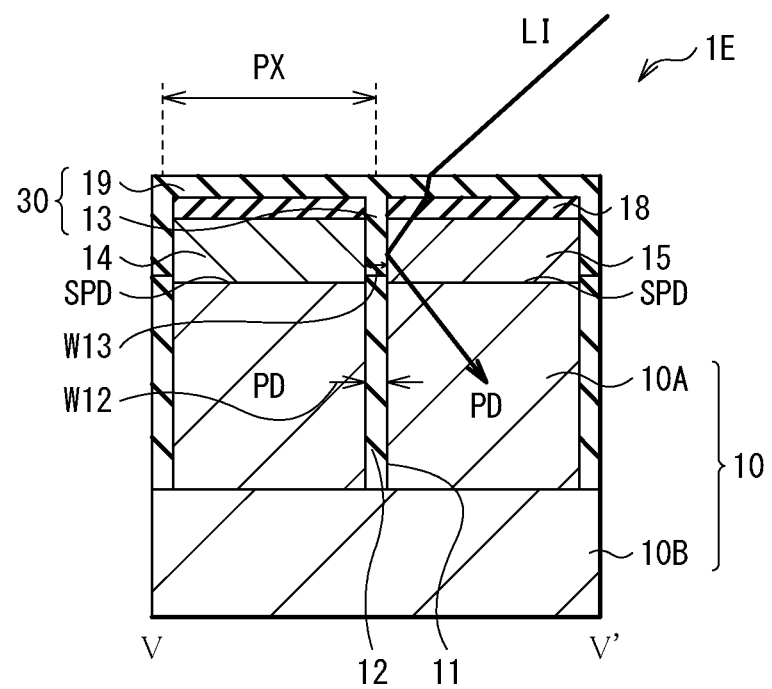
FIG. 11B is a diagram illustrating an example of a cross-sectional configuration of the imaging device of FIG. 11A taken along V-V'.
Figure 12A:
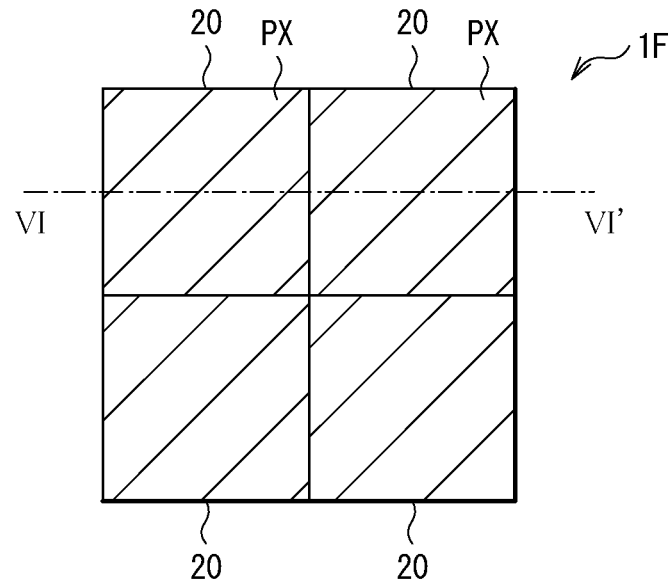
FIG. 12A is a diagram illustrating an example of a planar configuration of an imaging device according to Modification Example F.
Figure 12B:
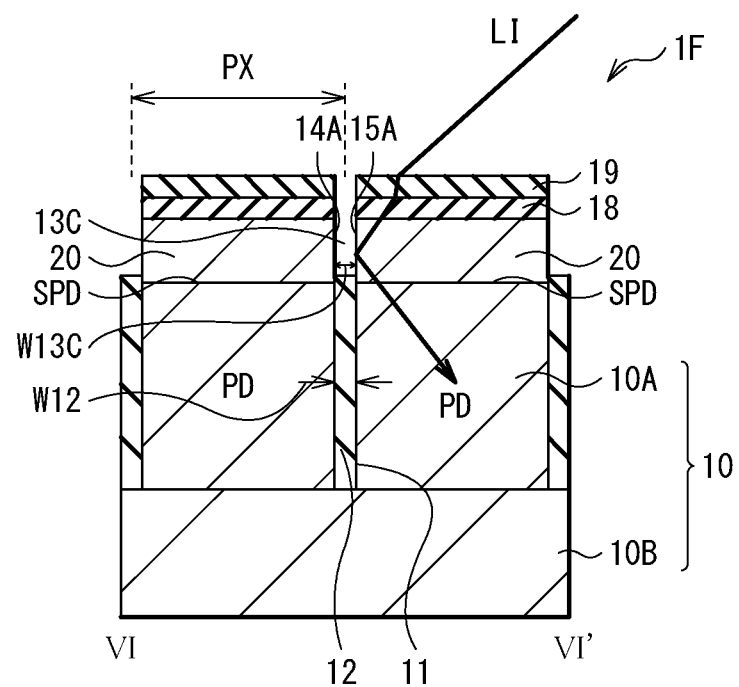
FIG. 12B is a diagram illustrating an example of a cross-sectional configuration of the imaging device of FIG. 12A taken along VI-VI'.
Figure 13A:
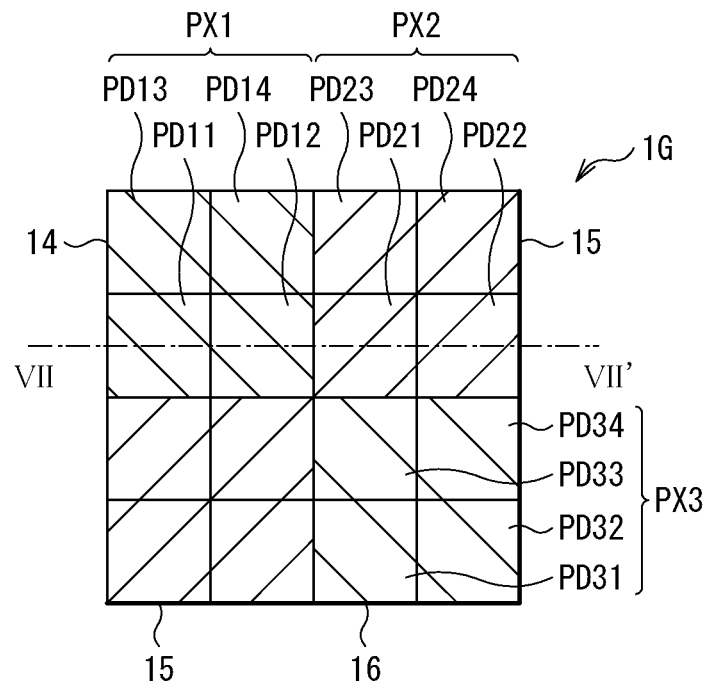
FIG. 13A is a diagram illustrating an example of a planar configuration of an imaging device according to Modification Example G.
Figure 13B:
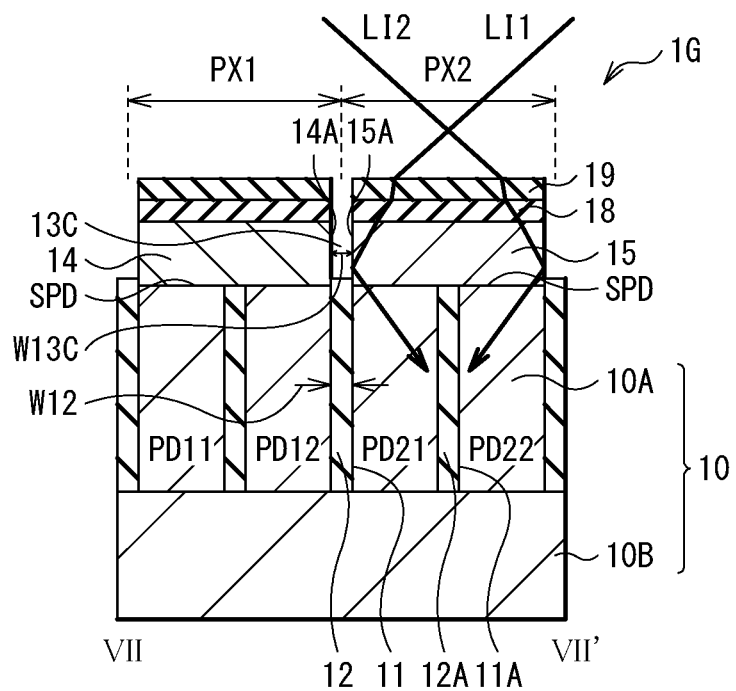
FIG. 13B is a diagram illustrating an example of a cross-sectional configuration of the imaging device of FIG. 13A taken along VII-VII'.
Figure 14:
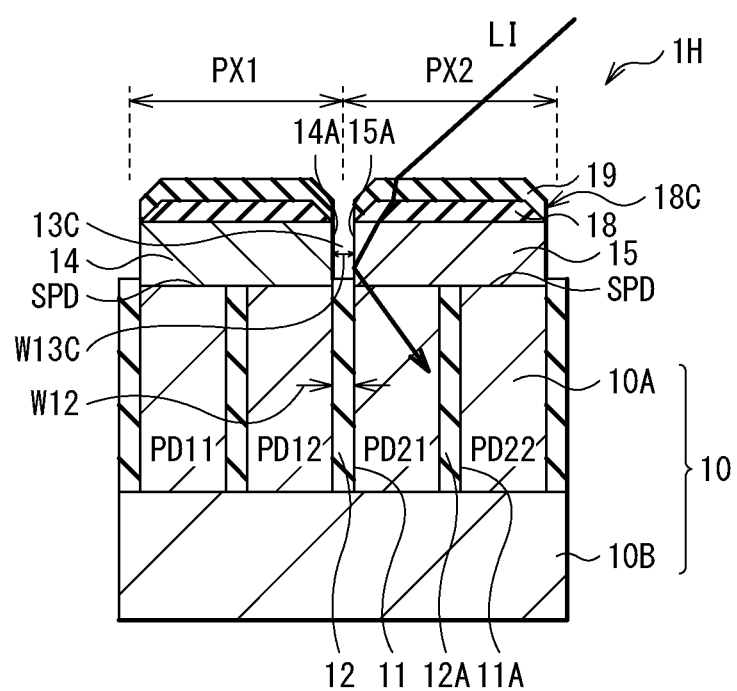
FIG. 14 is a diagram illustrating an example of a cross-sectional configuration of an imaging device according to Modification Example H.

Modification Example E: an example in which the film having the third refractive index is provided in a layer common to an antireflection film . . . FIGS. 11A and 11B Modification Example F: an example including monochrome pixels, with air used for the inter-pixel light-blocking section . . . FIGS. 12A and 12B Modification Example G: an example in which one color filter is shared among four photoelectric conversion elements . . . FIGS. 13A and 13B Modification Example H: an example in which the end part of the color filter has a tapered shape . . . FIG. 14

Figure 15A:
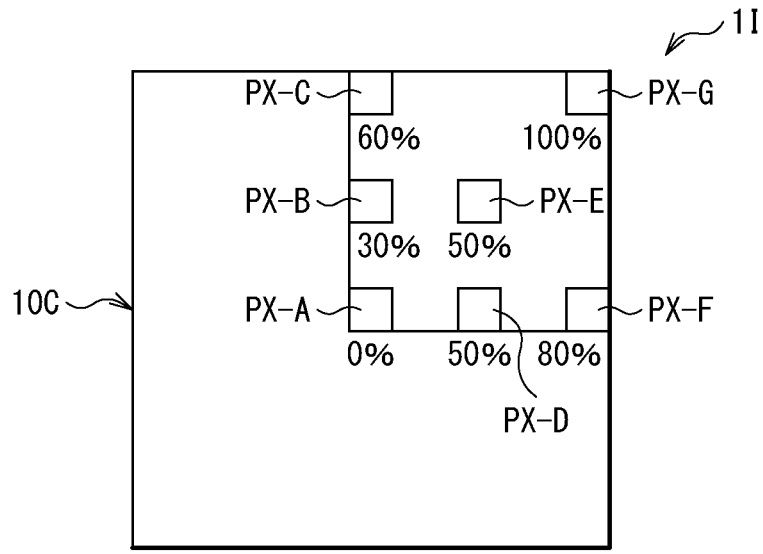
FIG. 15A is a diagram illustrating an example of a planar configuration of an imaging device according to Modification Example I.
Figure 15B:
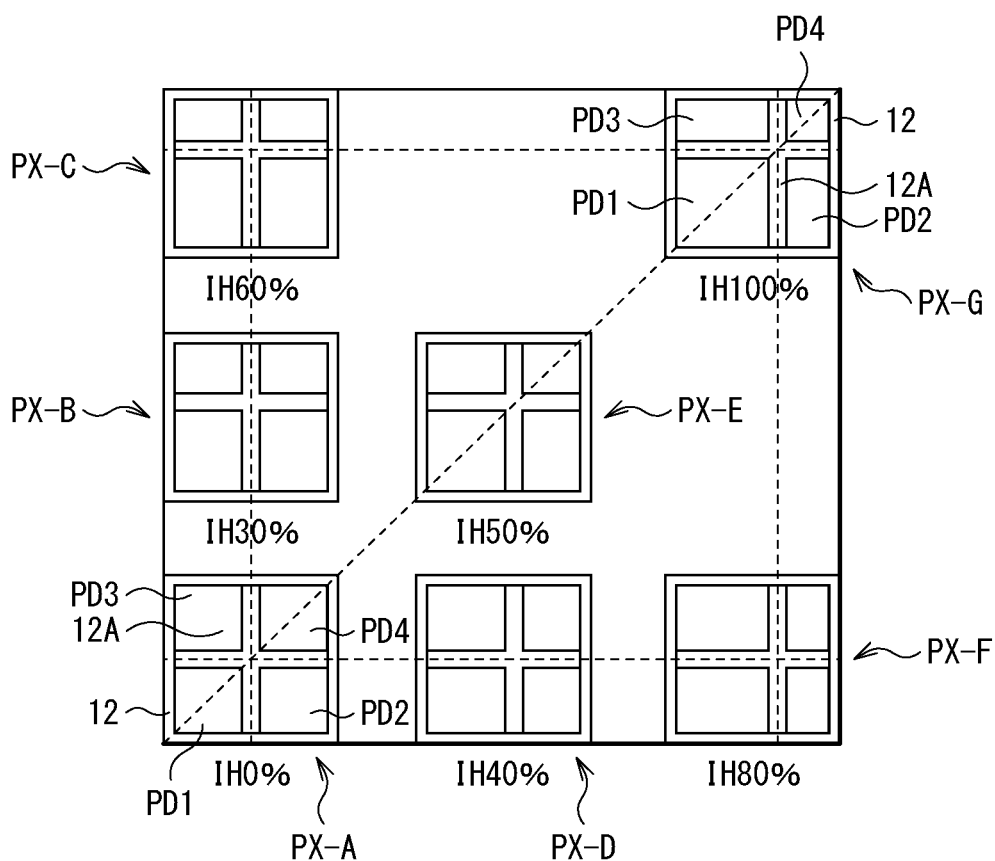
FIG. 15B is an enlarged view of a main part of FIG. 15A.
Figure 16A:
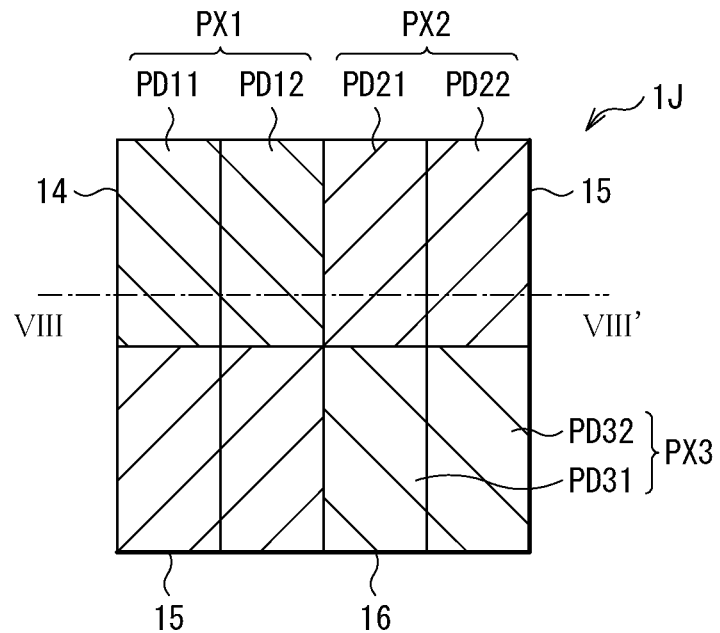
FIG. 16A is a diagram illustrating an example of a planar configuration of an imaging device according to Modification Example J.
Figure 16B:
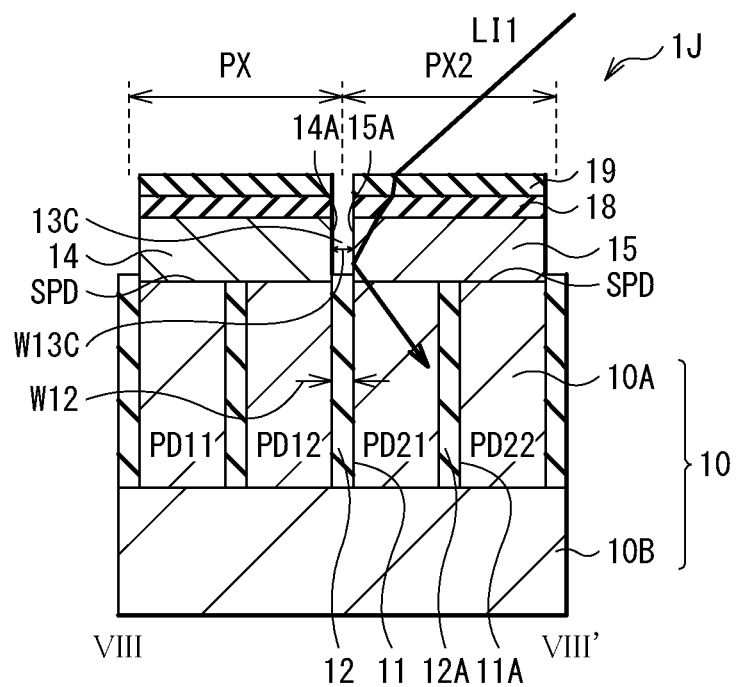
FIG. 16B is a diagram illustrating an example of a cross-sectional configuration of the imaging device of FIG. 16A taken along VIII-VIII'.
Figure 17A:
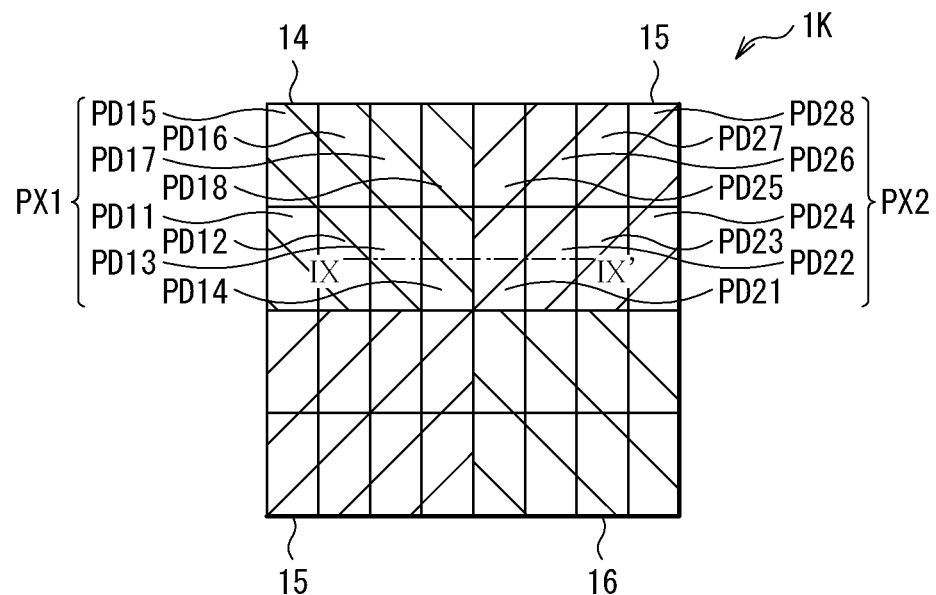
FIG. 17A is a diagram illustrating an example of a planar configuration of an imaging device according to Modification Example K.
Figure 17B:
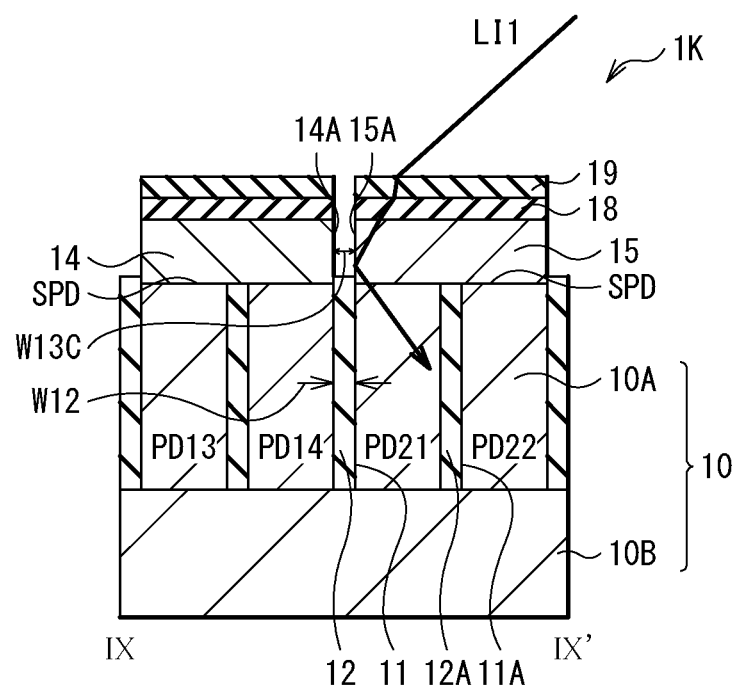
FIG. 17B is a diagram illustrating an example of a cross-sectional configuration of the imaging device of FIG. 17A taken along IX-IX'.
Figure 18A:
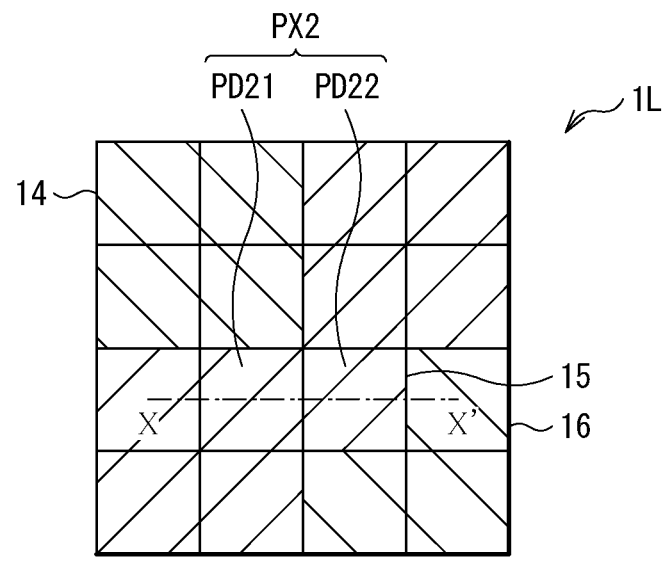
FIG. 18A is a diagram illustrating an example of a planar configuration of an imaging device according to Modification Example L.
Figure 18B:
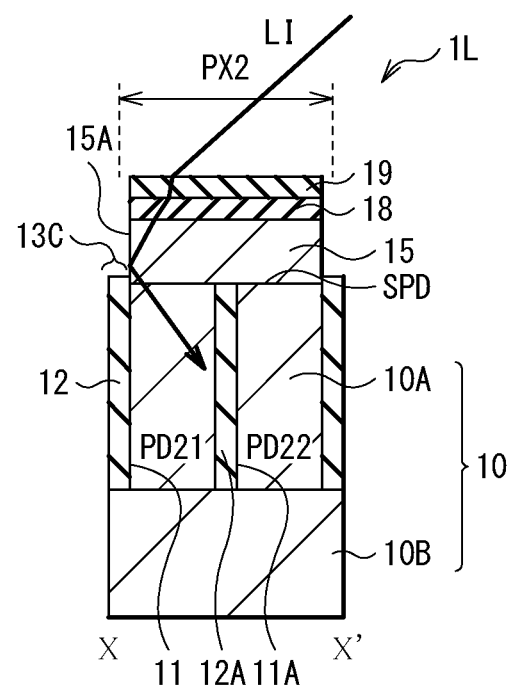
FIG. 18B is a diagram illustrating an example of a cross-sectional configuration of the imaging device of FIG. 18A taken along X-X'.
Figure 19:
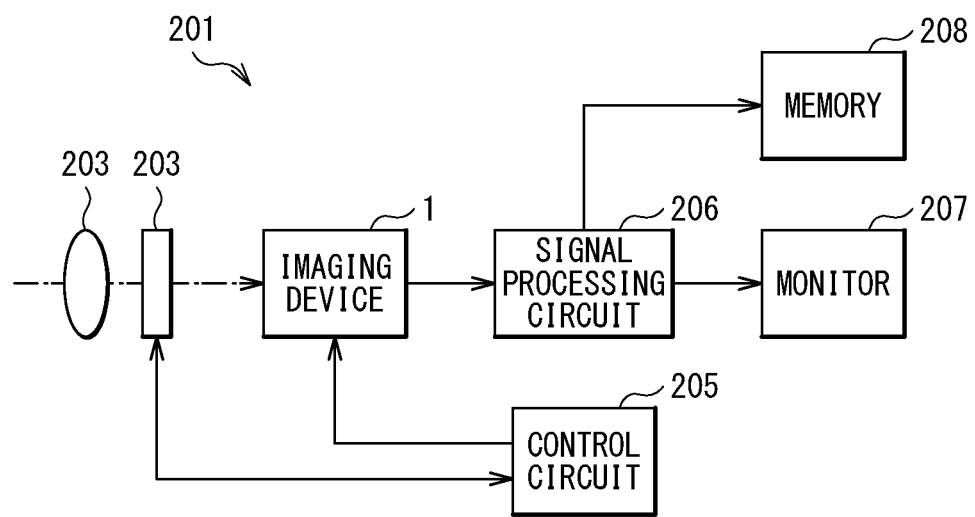
FIG. 19 is a block diagram illustrating an example of a schematic configuration of an electronic apparatus including the imaging device according to any of the foregoing embodiment and modification examples thereof.

Modification Example I: an example including a pupil-corrected layout . . . FIGS. 15A and 15B Modification Example J: an example including a rectangular photoelectric conversion element . . . FIGS. 16A and 16B Modification Example K: an example in which one color filter is shared among eight rectangular photoelectric conversion elements . . . FIGS. 17A and 17B Modification Example L: an example in which one color filter is shared between two square photoelectric conversion elements . . . FIGS. 18A and 18B 3. Application Examples Application Example 1: An example of application of the imaging device according to any of the foregoing embodiment and modification examples thereof to an electronic apparatus . . . FIG. 19

Figure 20:
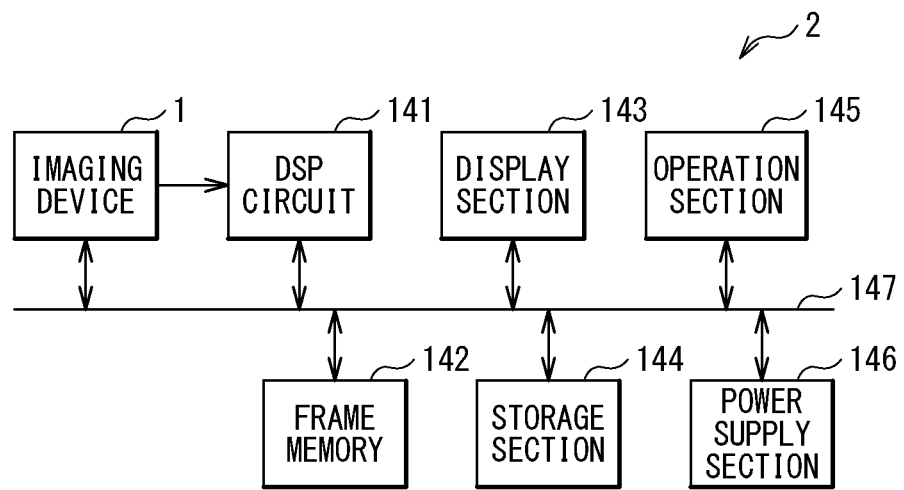
FIG. 20 is a diagram illustrating an example of a schematic configuration of an imaging system including the imaging device according to any of the foregoing embodiment and modification examples thereof.
Figure 21:
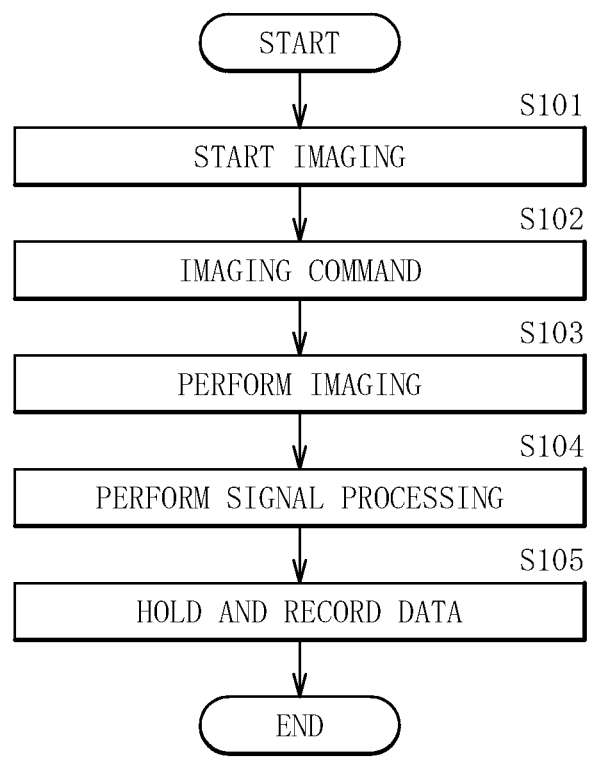
FIG. 21 is a diagram illustrating an example of an imaging procedure by the imaging system of FIG. 20.

Application Example 2: An example of application of the imaging device according to any of the foregoing embodiment and modification examples thereof to an imaging system . . . FIGS. 20 and 21

4. Practical Application Examples

Figure 22:
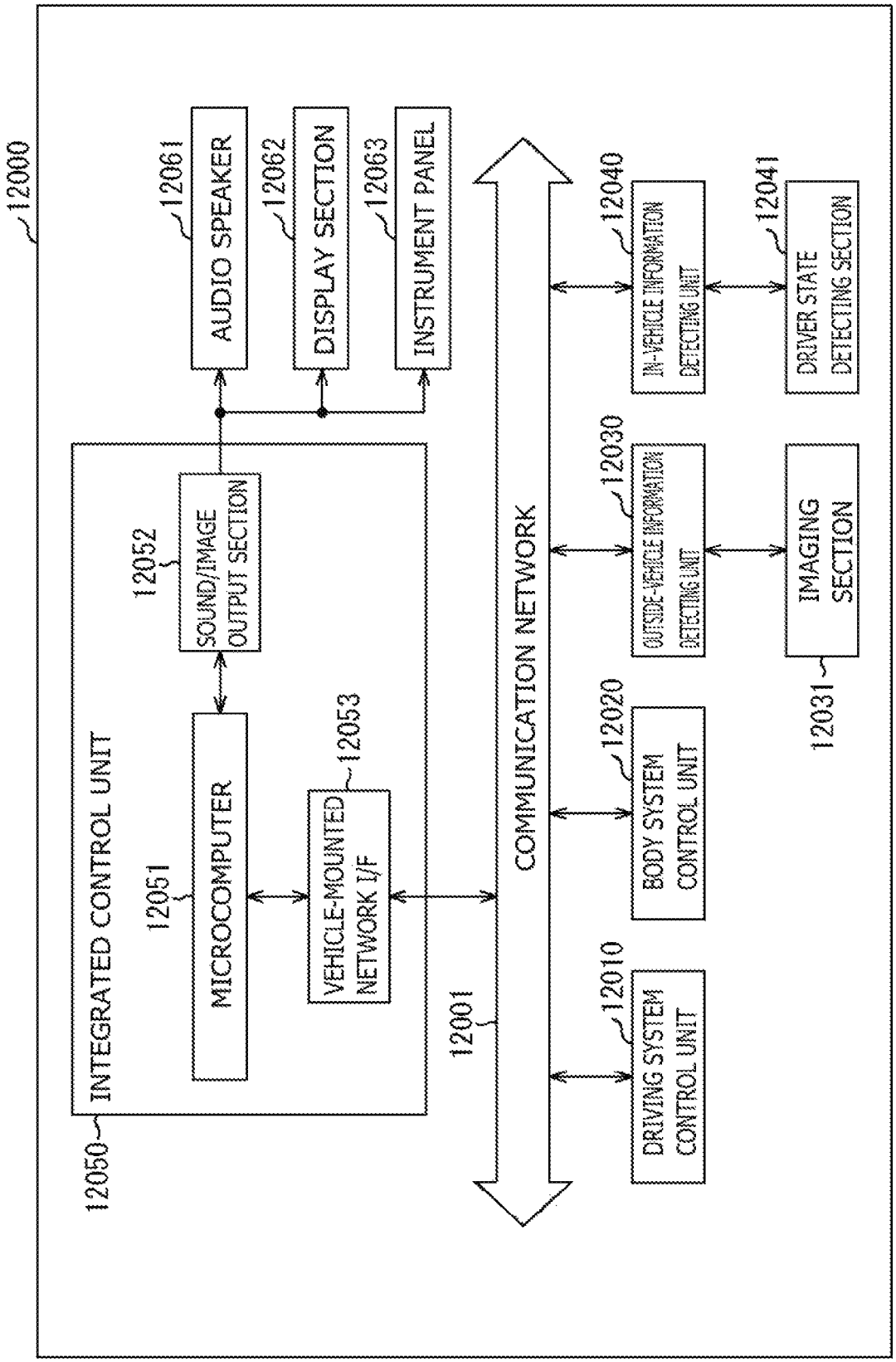
FIG. 22 is a block diagram depicting an example of schematic configuration of a vehicle control system.
Figure 23:
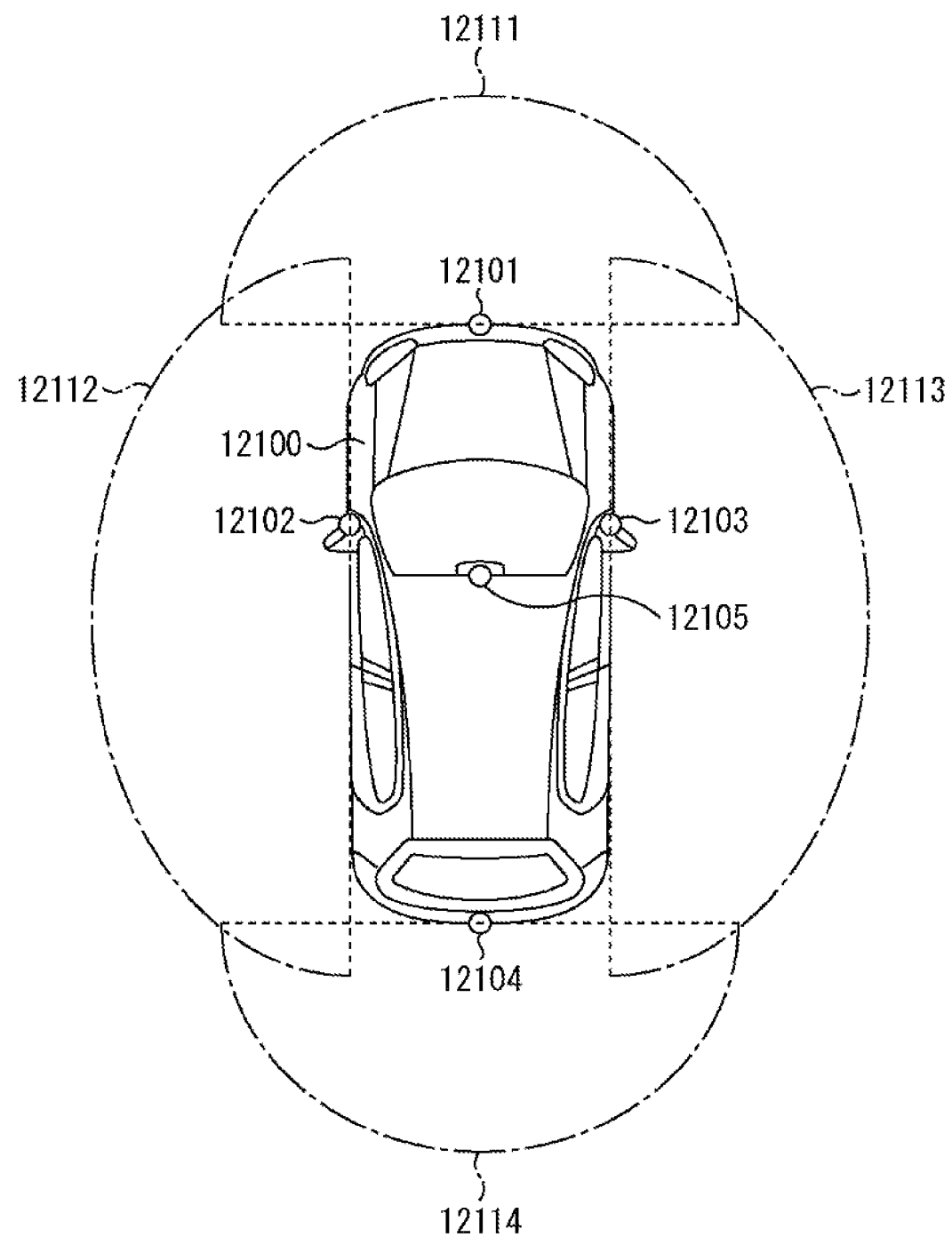
FIG. 23 is a diagram of assistance in explaining an example of installation positions of an outside-vehicle information detecting section and an imaging section.

Practical Application Example 1: An example of practical application of the imaging device according to any of the foregoing embodiment and modification examples thereof to a mobile body . . . FIGS. 22 and 23

Figure 24:
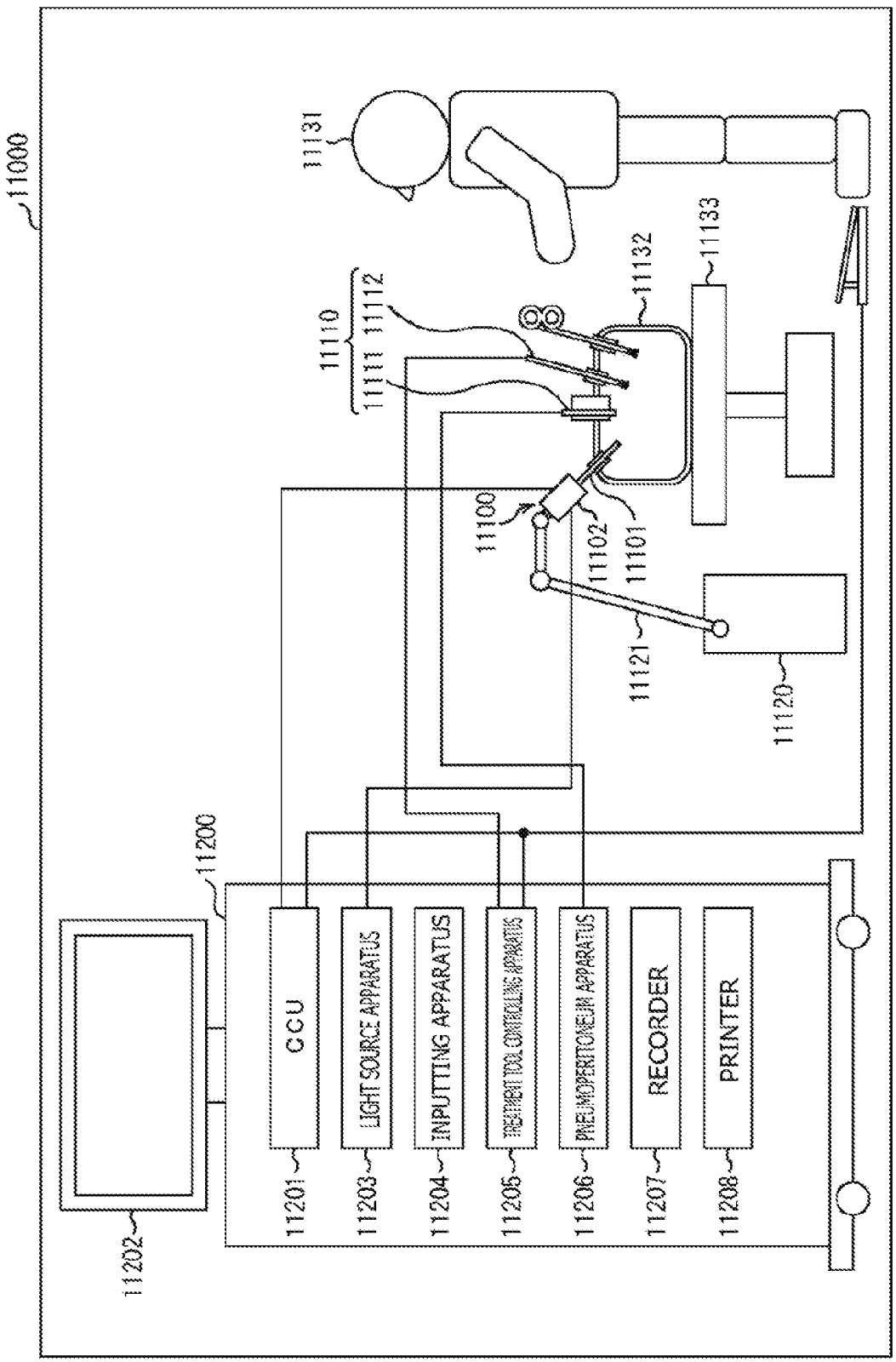
FIG. 24 is a view depicting an example of a schematic configuration of an endoscopic surgery system.
Figure 25:
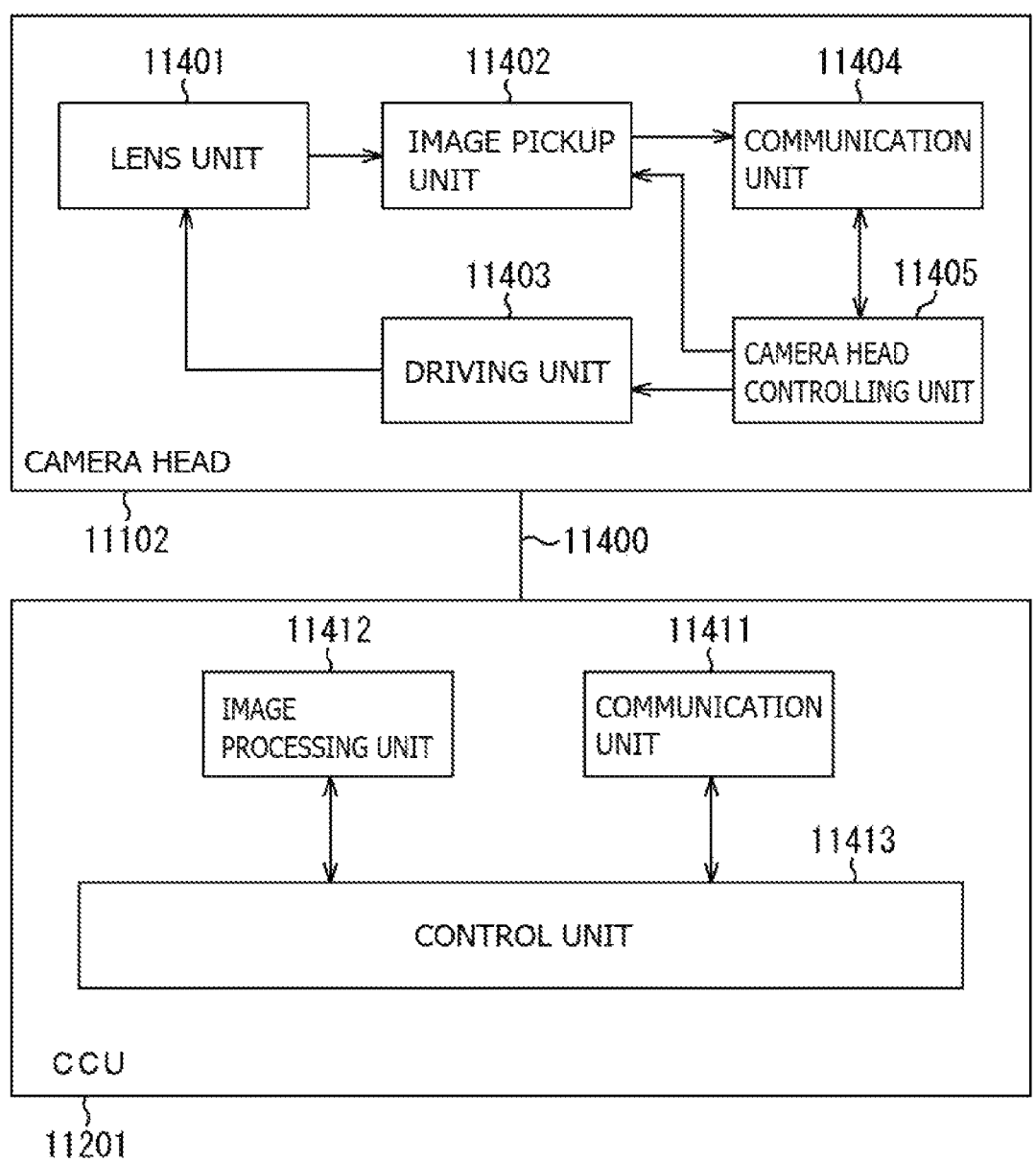
FIG. 25 is a block diagram depicting an example of a functional configuration of a camera head and a camera control unit (CCU).

Practical Application Example 2: An example of practical application of the imaging device according to any of the foregoing embodiment and modification examples thereof to an endoscopic surgery system . . . FIGS. 24 and 25

5. Other Modification Examples

<1. Embodiment>

[Configuration Example]

Figure 1A:
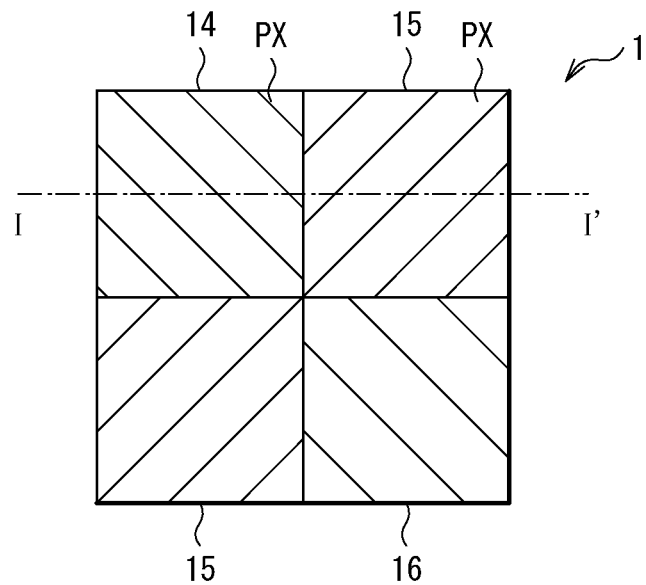
FIG. 1A is a diagram illustrating an example of a planar configuration of an imaging device according to an embodiment of the disclosure.
Figure 1B:
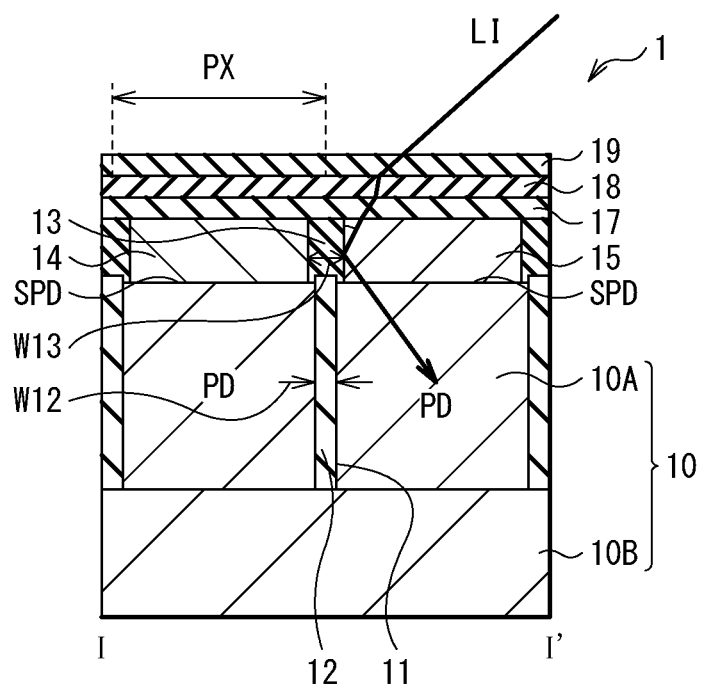
FIG. 1B is a diagram illustrating an example of a cross-sectional configuration of the imaging device of FIG. 1A taken along I-I'.

FIG. 1A illustrates an example of a planar configuration of an imaging device 1 according to an embodiment of the present disclosure. FIG. 1B illustrates an example of a cross-sectional configuration of the imaging device 1 of FIG. 1A taken along I-I'. In FIG. 1A, illustrations of an antireflection film 19, a high refractive index film 18, a low refractive index film 17, and an inter-pixel light-blocking film 13 are omitted in order to illustrate a layout of color filters CF (a red filter 14, a green filter 15, and a blue filter 16).

The imaging device 1 includes a plurality of pixels PX. The plurality of pixels PX corresponds to a specific example of a "plurality of pixels" of the present disclosure. The plurality of pixels PX each has a stacked structure in which a semiconductor substrate 10, the color filter (the red filter 14, the green filter 15, and the blue filter 16), the low refractive index film 17, the high refractive index film 18, and the antireflection film 19 are stacked in order in a stacking direction. The plurality of pixels PX is arranged in an in-plane direction orthogonal to the stacking direction. The semiconductor substrate 10 is provided with a photodiode PD including a light entrance surface SPD. The photodiode PD corresponds to a specific example of a "photoelectric conversion section" of the present disclosure. The photodiode PD includes an n-type semiconductor region 10A and a p-type semiconductor region 10B, and performs photoelectric conversion. The color filter CF (the red filter 14, the green filter 15, and the blue filter 16) corresponds to a specific example of a "first light transmissive film" of the present disclosure. The high refractive index film 18 corresponds to a specific example of a "second light transmissive film" of the present disclosure. The inter-pixel light-blocking film 13 is provided between a plurality of color filters CF (the red filter 14, the green filter 15, and the blue filter 16) adjacent to each other in the in-plane direction. The inter-pixel light-blocking film 13 corresponds to a specific example of a "first pixel separation film" of the present disclosure. A region between a plurality of photodiodes PD adjacent to each other is a pixel separation region. The semiconductor substrate 10 in the pixel separation region is provided with a pixel separation film 12, and the photodiodes PD are partitioned for individual pixels PX. The pixel separation film 12 corresponds to a specific example of a "second pixel separation film" of the present disclosure. In FIG. 1A, a planar configuration corresponding to four pixels in a 2×2 arrangement is illustrated, and in FIG. 1B, a cross-sectional configuration corresponding to two pixels is illustrated. A wavelength region of light targeted for reception by the photodiode PD of the imaging device 1 is the visible region (e.g., greater than or equal to 400 nm and less than or equal to 700 nm).

The semiconductor substrate 10 is provided with a transfer gate (not illustrated) that extracts a signal electric charge generated and accumulated in the photodiode PD in each pixel PX, and a circuit section (not illustrated) that outputs the extracted signal electric charge and performs signal processing thereon. The signal electric charge extracted from the photodiode PD of each pixel PX is configured to be subjected to the signal processing such as CDS (correlated double sampling) processing by the circuit section (not illustrated) to be thereby converted into a digital signal, and to be outputted to the outside.

Figure 2:
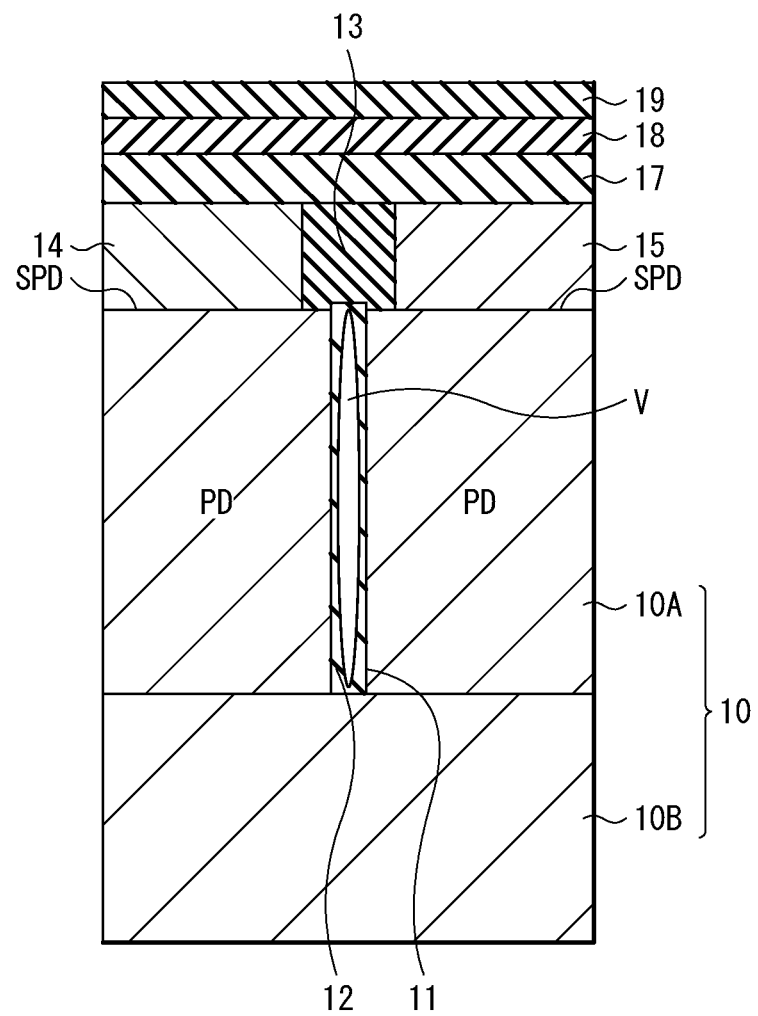
FIG. 2 is an enlarged view of a main part of FIG. 1A.

In a surface of the semiconductor substrate 10, a pixel separation groove 11 is formed in the pixel separation region. The pixel separation film 12 is provided in the pixel separation groove 11. The photodiodes PD are partitioned for individual pixels PX by the pixel separation film 12. The pixel separation film 12 optically separates the pixels PX from each other, or electrically separates the pixels PX from each other. Alternatively, the pixel separation film 12 may optically and electrically separate the pixels PX from each other. The pixel separation film 12 includes an insulator such as silicon oxide ($SiO_2$). The pixel separation film 12 may also include a single-layer or multi-layer film of an isolator such as tantalum oxide ($Ta_2O_5$), hafnium oxide ($HfO_2$), or aluminum oxide ($Al_2O_3$). Alternatively, the pixel separation film 12 may include a stack including a single-layer film or a multi-layer film of an insulator such as tantalum oxide, hafnium oxide, or aluminum oxide, and a silicon oxide film. The pixel separation film 12 including the above-described insulator separates the pixels PX from each other optically and electrically. The pixel separation film 12 including an insulator and provided in the pixel separation groove 11 is also referred to as RDTI (Rear Deep Trench Isolation). Further, the pixel separation film 12 may have a configuration having a space inside the pixel separation groove 11. Even in that case, it is possible to separate the pixels PX from each other optically and electrically. For example, as illustrated in FIG. 2, the pixel separation film 12 may have a configuration in which a void V extending in a depth direction is formed in an insulator such as silicon oxide that configures the pixel separation film 12. The void V makes it possible to improve the optical separation characteristic for the pixels PX, in addition to separation by the insulator. Further, the pixel separation film 12 may be a p-type semiconductor region formed in the semiconductor substrate 10. In this case, the pixel separation groove 11 may not necessarily be formed. Pixel separation by the p-type semiconductor region allows for electrical separation of the pixels PX from each other. Further, the pixel separation film 12 may include a metal having a light-blocking property, such as tantalum (Ta), aluminum (Al), silver (Ag), gold (Au), or copper (Cu). In this case, it is possible to optically separate the pixels PX from each other. A width (W12) of the pixel separation film 12 between two adjacent pixels PX is, for example, greater than or equal to 30 nm and less than or equal to 300 nm.

As illustrated in FIG. 1B, on a surface the semiconductor substrate 10 on a light entrance side, the color filters CF are formed to be separately provided for individual pixels PX.

The color filters CF include, for example, the red filter 14, the green filter 15, and the blue filter 16. The color filters CF (the red filter 14, the green filter 15, and the blue filter 16) each have a refractive index $n_{CF}$. The refractive index $n_{CF}$ corresponds to a specific example of a "first refractive index" of the present disclosure. For one pixel PX, one color filter CF selected from the red filter 14, the green filter 15, and the blue filter 16 is provided. Here, the wavelength region of light targeted for reception by the imaging device 1 is the visible region (greater than or equal to 400 nm and less than or equal to 700 nm). The pixel PX provided with the red filter 14 is a red pixel, the pixel PX provided with the green filter 15 is a green pixel, and the pixel PX provided with the blue filter 16 is a blue pixel. The color filters CF (the red filter 14, the green filter 15, and the blue filter 16) include, for example, a photosensitive negative resist material or the like containing dyes of the respective colors. The color filters CF (the red filter 14, the green filter 15, and the blue filter 16) are provided in Bayer arrangement, for example. According to the Bayer arrangement, for any four pixels in a 2×2 arrangement, the color filters CF of first two diagonally arranged pixels PX are both green filters 15. Further, the color filters CF of the other two diagonally arranged pixels PX are the red filter 14 and the blue filter 16, respectively. The color filters CF are not limited to the red filter 14, the green filter 15, and the blue filter 16, and may have a configuration including, for example, at least one of a red filter, a green filter, a blue filter, a yellow filter, a magenta filter, a cyan filter, or a gray filter. The color filters CF (the red filter 14, the green filter 15, and the blue filter 16) may each have a film thickness of, for example, greater than or equal to 200 nm and less than or equal to 2 μm.

The color filters CF (the red filter 14, the green filter 15, the blue filter 16) are separated from each other for individual pixels PX by the inter-pixel light-blocking film 13 formed in the inter-pixel light-blocking region. That is, the inter-pixel light-blocking film 13 is provided between the adjacent color filters CF (the red filter 14, the green filter 15, the blue filter 16). The inter-pixel light-blocking film 13 includes a material having a refractive index $n_{13}$, for example. The refractive index $n_{13}$ corresponds to a specific example of a "third refractive index" of the present disclosure. The refractive index $n_{13}$ of the inter-pixel light-blocking film 13 is lower than the refractive index $n_{CF}$ of the color filters CF (the red filter 14, the green filter 15, and the blue filter 16). The refractive index $n_{13}$ satisfies, for example, $1 < n_{13} \leq 1.5$ (a refractive index for light having a wavelength of 530 nm). For example, it includes silicon oxide. A width W13 of the inter-pixel light-blocking film 13 between two adjacent color filters CF (the red filter 14, the green filter 15, and the blue filter 16) is equivalent to or greater than the width W12 of the pixel separation film between two adjacent pixels PX. The width W13 of the inter-pixel light-blocking film 13 is preferably larger than the width W12 of the pixel separation film. For example, top surfaces of the color filters CF (the red filter 14, the green filter 15, the blue filter 16) and a top surface of the inter-pixel light-blocking film 13 are flat surfaces of the same level.

The low refractive index film 17 is formed to cover the top surfaces of the color filters CF (the red filter 14, the green filter 15, the blue filter 16) and the top surface of the inter-pixel light-blocking film 13. The low refractive index film 17 has a refractive index lower than the refractive index $n_{CF}$ of the color filters CF (the red filter 14, the green filter 15, and the blue filter 16). The low refractive index film 17 includes silicon oxide, for example. In the imaging device 1, the high refractive index film 18 may be provided to cover the top surfaces of the color filters CF (the red filter 14, the green filter 15, the blue filter 16) and the top surface of the inter-pixel light-blocking film 13, without providing the low refractive index film 17.

The high refractive index film 18 is formed as an upper layer of the low refractive index film 17. The high refractive index film 18 includes a material having a refractive index $n_{18}$, for example. The refractive index $n_{18}$ corresponds to a specific example of a "second refractive index" of the present disclosure. The refractive index $n_{18}$ of the high refractive index film 18 is higher than the refractive index $n_{CF}$ of the color filters CF (the red filter 14, the green filter 15, and the blue filter 16). The refractive index $n_{18}$ satisfies, for example, $1.5 < n_{18} \leq 4.2$ (a refractive index for light having a wavelength of 530 nm). The high refractive index film 18 includes silicon nitride ($Si_3N_4$), for example. Alternatively, a stack of titanium oxide ($TiO_2$)/tantalum oxide/hafnium oxide or the like may be used. The high refractive index film 18 has a film thickness of, for example, greater than or equal to 30 nm and less than or equal to 300 nm. The high refractive index film 18 may not necessarily be separately provided for individual pixels PX. That is, the high refractive index film 18 may be a film that is formed above the color filters CF (the red filter 14, the green filter 15, the blue filter 16) and above the inter-pixel light-blocking film 13 and that is common to all the pixels PX. Alternatively, the high refractive index film 18 may be separately provided for individual pixels PX. That is, the high refractive index film 18 may be configured to be formed above the color filters CF (the red filter 14, the green filter 15, the blue filter 16), and not above the inter-pixel light-blocking film 13.

The antireflection film 19 is formed as an upper layer of the high refractive index film 18. The antireflection film 19 includes, for example, silicon oxide, and has a refractive index lower than that of the high refractive index film 18. The antireflection film 19 has a film thickness of, for example, greater than or equal to 30 nm and less than or equal to 300 nm.

It is to be noted that, like the high refractive index film 18, the antireflection film 19 may not necessarily be separately provided for individual pixels PX, or may be separately provided for individual pixels PX. Further, like the antireflection film 19, the p-type semiconductor region 10B and the low refractive index film 17 may not necessarily be separately provided for individual pixels PX, or may be separately provided for individual pixels PX.

The imaging device 1 is not provided with an on-chip lens. The imaging device 1 is configured to allow light from the outside of the imaging device 1 to pass through the antireflection film 19, the high refractive index film 18, the low refractive index film 17, and the color filter CF (the red filter 14, the green filter 15, the blue filter 16) one by one to enter the photodiode PD.

[Manufacturing Method]

Next, a method of manufacturing the imaging device 1 will be described. FIGS. 3A to 3J each illustrate an example of a manufacturing process of the imaging device 1.

Figure 3A:
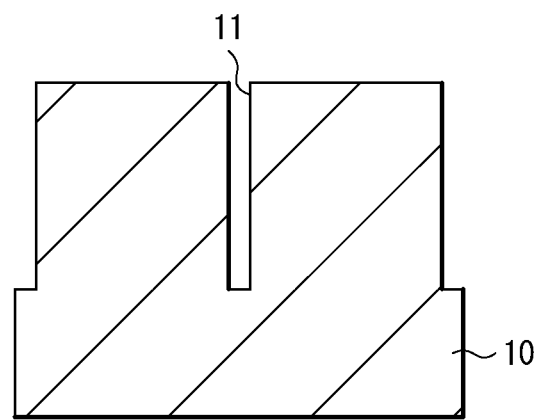
FIG. 3A is a diagram illustrating an example of a cross-sectional configuration in a manufacturing process of the imaging device of FIG. 1A.

First, as illustrated in FIG. 3A, the pixel separation groove 11 is formed at a position corresponding to the pixel separation region of the semiconductor substrate 10. Specifically, for example, a resist pattern having an opening at a position corresponding to the pixel separation region of the semiconductor substrate 10 is formed to cover the semiconductor substrate 10. Thereafter, the semiconductor substrate 10 is subjected to an etching process such as reactive ion etching (ME: Reactive Ion Etching) using the resist pattern as a mask. By doing so, a portion of the semiconductor substrate 10 is selectively removed to form the pixel separation groove 11. After the above-described etching process, the above-described resist pattern covering the semiconductor substrate 10 is removed.

Figure 3B:
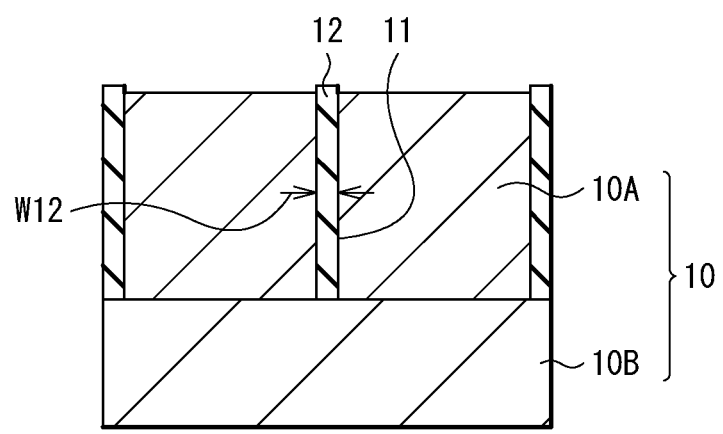
FIG. 3B is a diagram illustrating an example of a cross-sectional configuration in a manufacturing process subsequent to FIG. 3A.

Next, an insulator such as silicon oxide is deposited by, for example, a CVD (Chemical Vapor Deposition) method or an ALD (Atomic Layer Deposition) method to fill the pixel separation groove 11, and thereafter, unwanted portions of the deposited insulator are removed. By doing so, as illustrated in FIG. 3B, the pixel separation film 12 is formed in the pixel separation groove 11. Subsequently, the n-type semiconductor region 10A and the p-type semiconductor region 10B are formed by ion implantation or the like to form the photodiode PD that performs photoelectric conversion. It is to be noted that the pixel separation groove 11 and the pixel separation film 12 may be formed after the photodiode PD is formed.

Figure 3C:
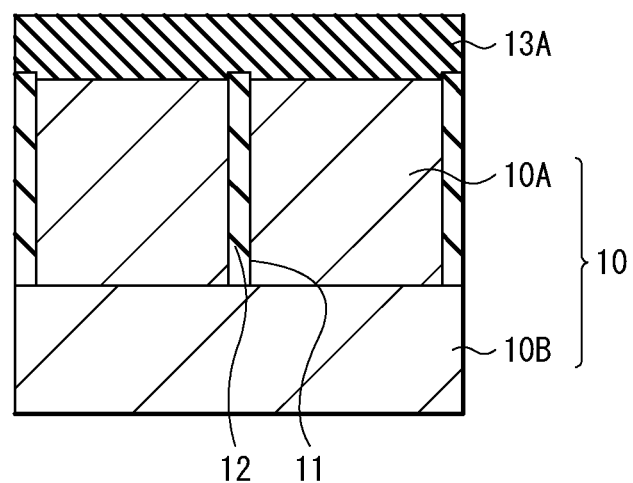
FIG. 3C is a diagram illustrating an example of a cross-sectional configuration in a manufacturing process subsequent to FIG. 3B.

Subsequently, as illustrated in FIG. 3C, an insulator such as silicon oxide is deposited by, for example, a CVD method to form an insulating film 13A. The insulating film 13A is formed to have a film thickness equivalent to the film thickness of the color filters CF (the red filter 14, the green filter 15, the blue filter 16) to be formed in a later step.

Figure 3D:
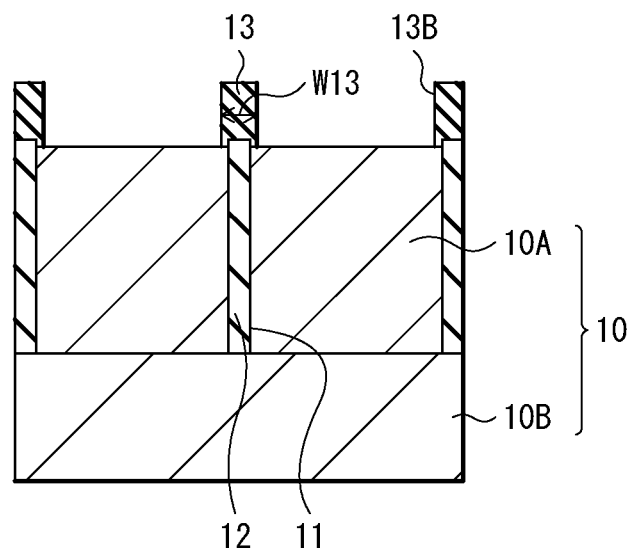
FIG. 3D is a diagram illustrating an example of a cross-sectional configuration in a manufacturing process subsequent to FIG. 3C.

Next, a resist pattern having an opening in a region where the color filters CF (the red filter 14, the green filter 15, the blue filter 16) are to be formed is formed to cover the insulating film 13A. Thereafter, the insulating film 13A is subjected to an etching process such as RIE using the resist pattern covering the insulating film 13A as a mask. By doing so, the insulating film 13A is selectively removed to form a recessed part 13B for the color filter as illustrated in FIG. 3D. At this time, the remaining portion becomes the inter-pixel light-blocking film 13. After the etching process on the insulating film 13A described above, the resist pattern covering the insulating film 13A is removed.

Figure 3E:
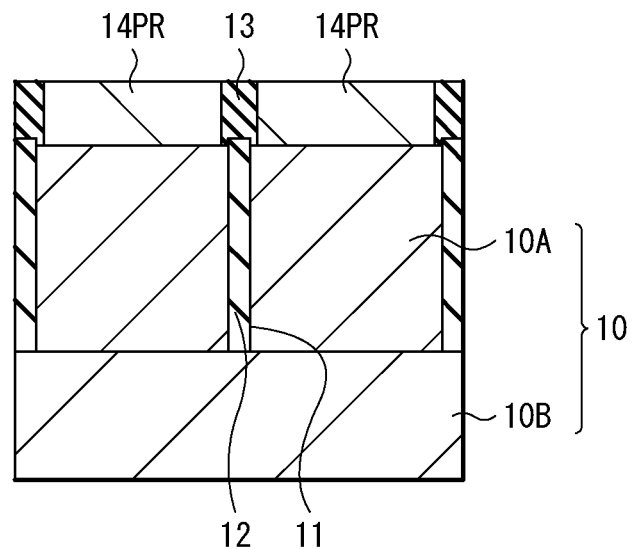
FIG. 3E is a diagram illustrating an example of a cross-sectional configuration in a manufacturing process subsequent to FIG. 3D.

Subsequently, as illustrated in FIG. 3E, a photosensitive negative resist film 14PR containing a red dye is formed by applying a photosensitive negative resist material containing the red dye to fill the recessed part 13B for the color filter.

Figure 3F:
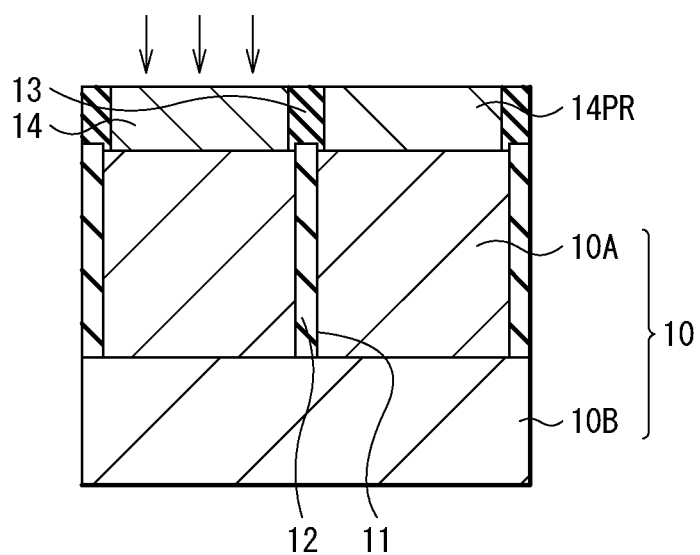
FIG. 3F is a diagram illustrating an example of a cross-sectional configuration in a manufacturing process subsequent to FIG. 3E.

Next, as illustrated in FIG. 3F, an exposure process is performed selectively on the photosensitive negative resist film 14PR at the red pixel to form the red filter 14.

Figure 3G:
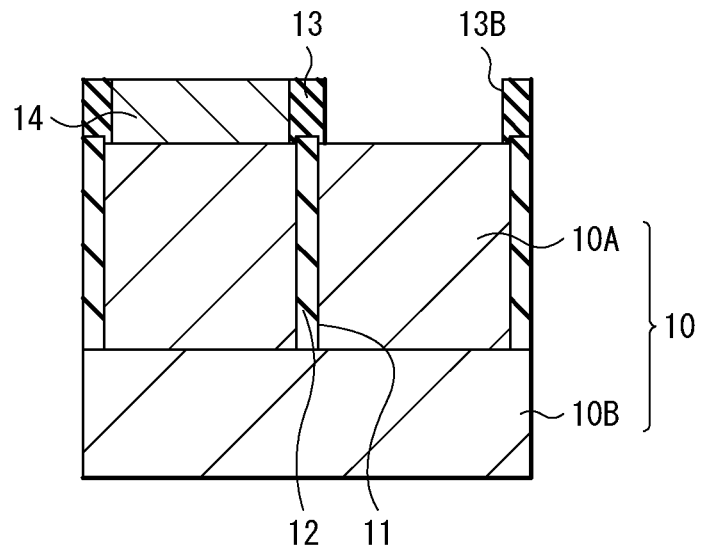
FIG. 3G is a diagram illustrating an example of a cross-sectional configuration in a manufacturing process subsequent to FIG. 3F.

Subsequently, as illustrated in FIG. 3G, the photosensitive negative resist film 14PR that is provided in a region other than the region where the red filter 14 is formed and that has not been subjected to the exposure process is removed. As a result, the recessed part 13B for the color filter for forming the color filter CF (the green filter 15, the blue filter 16) is opened.

Figure 3H:
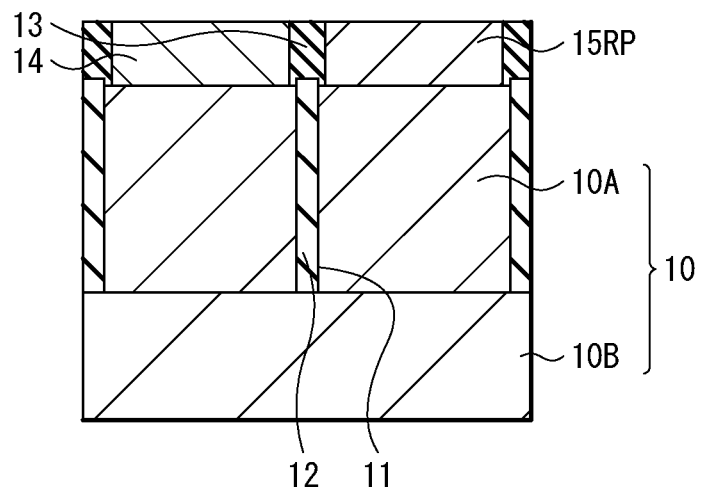
FIG. 3H is a diagram illustrating an example of a cross-sectional configuration in a manufacturing process subsequent to FIG. 3G.

Next, as illustrated in FIG. 3H, a photosensitive negative resist film 15PR containing a green dye is formed by applying a photosensitive negative resist material containing the green dye to fill the recessed part 13B for the color filter.

Figure 3I:
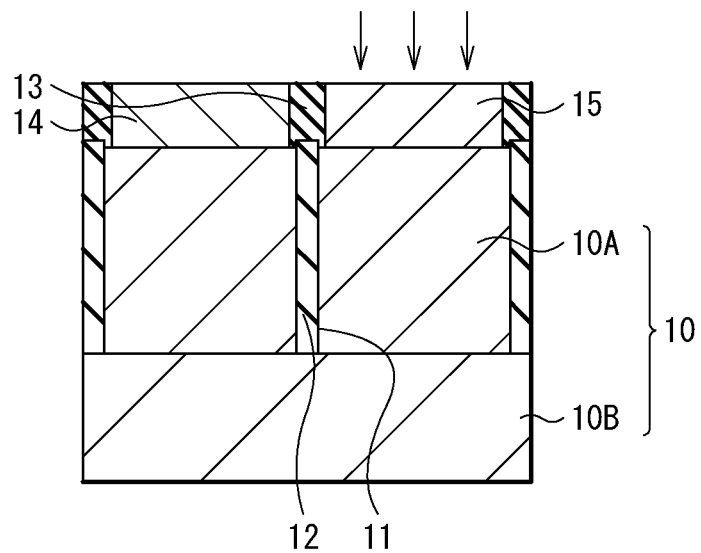
FIG. 3I is a diagram illustrating an example of a cross-sectional configuration in a manufacturing process subsequent to FIG. 3H.

Next, as illustrated in FIG. 3I, an exposure process is performed selectively on the photosensitive negative resist film 15PR at the green pixel to form the green filter 15. Subsequently, the photosensitive negative resist film 15PR that is provided in a region other than the region where the green filter 15 is formed and that has not been subjected to the exposure process is removed. Further, the blue filter 16 is formed in an unillustrated region in a manner similar to the method of forming the red filter 14 and the method of forming the green filter 15.

Figure 3J:
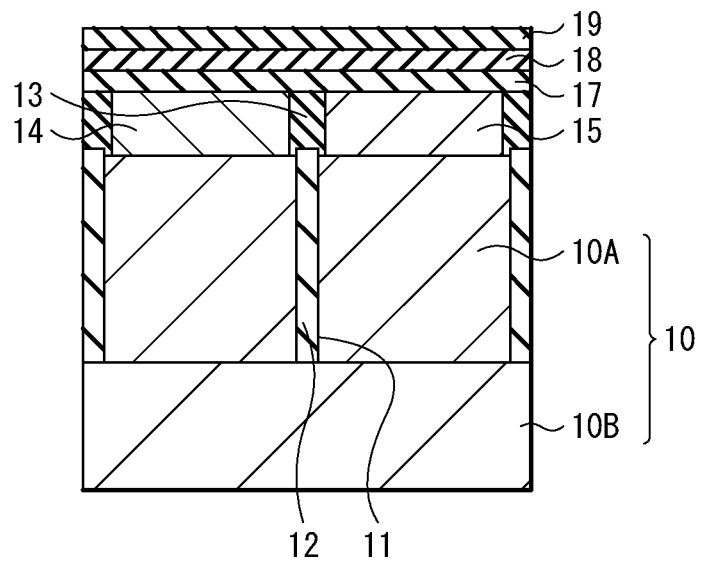
FIG. 3J is a diagram illustrating an example of a cross-sectional configuration in a manufacturing process subsequent to FIG. 3I.

Next, as illustrated in FIG. 3J, the low refractive index film 17 is formed by depositing silicon oxide or the like over the entire surface by, for example, a CVD method and the high refractive index film 18 is formed by further depositing silicon nitride or the by a CVD method. Subsequently, the antireflection film 19 is formed as the upper layer of the high refractive index film 18 by depositing silicon oxide or the like by a CVD method. In such a manner, the imaging device 1 is manufactured.

[Operation]

In the imaging device 1, upon entry of light of a wavelength targeted for reception into the photodiode PD provided in the semiconductor substrate 10 from the light entrance side (side of the high refractive index film 18), a signal electric charge is generated and accumulated. The signal electric charge is extracted from the photodiode PD of each pixel PX, and is subjected to signal processing such as CDS (correlated double sampling) processing by the signal processing circuit (not illustrated) to be converted into a digital signal, and the converted digital signal is outputted to the outside.

[Workings and Effects of Imaging Device 1]

Figure 4:
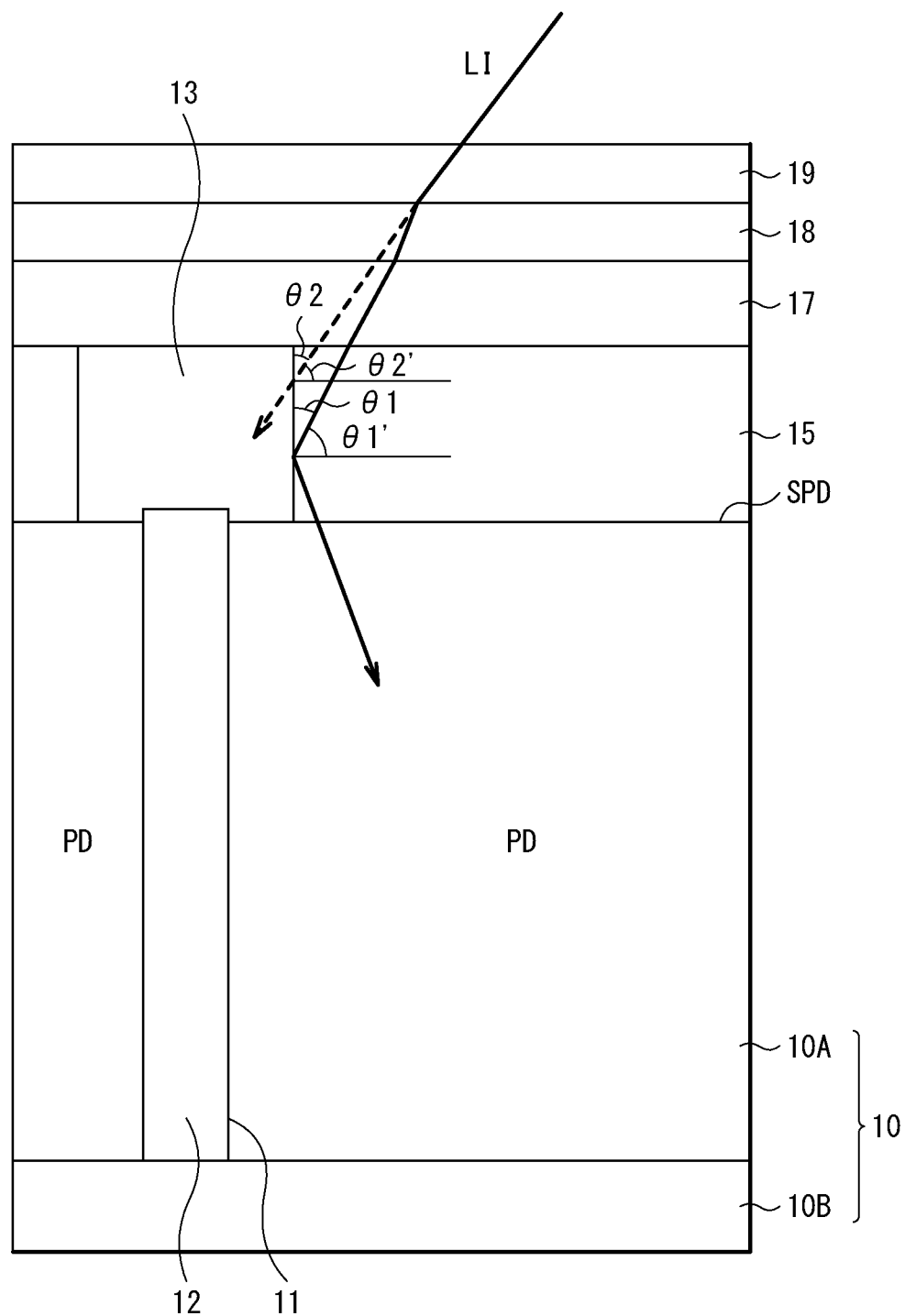
FIG. 4 is a diagram illustrating an example of a traveling path of entering light in the imaging device of FIG. 1A.

As illustrated in FIG. 4, in the imaging device 1 of the present embodiment, the high refractive index film 18 having the refractive index $n_{18}$ is formed on the light entrance side of the color filter CF (the red filter 14, the green filter 15, the blue filter 16) having the refractive index $n_{CF}$. The region between two adjacent color filters CF (the red filter 14, the green filter 15, the blue filter 16) is the inter-pixel light-blocking region, and the inter-pixel light-blocking film 13 having the refractive index $n_{13}$ is formed therein. Here, the refractive index $n_{18}$ is higher than the refractive index $n_{CF}$. Further, the refractive index $n_{13}$ is lower than the refractive index $n_{CF}$. Assume a case where light LI obliquely enters the pixel PX. The high refractive index film 18 having the refractive index $n_{18}$ refracts the light LI in a direction more perpendicular to a principal surface of the semiconductor substrate 10. As a result, an angle θ1 at which the light enters an interface between the inter-pixel light-blocking film 13 and the color filter CF (the red filter 14, the green filter 15, the blue filter 16) (an angle at which the light enters a wall side of the color filter CF) is made shallower than an angle θ2 of entry in a case where the high refractive index film 18 is not provided. That is, an entry angle θ1' with respect to the interface between the inter-pixel light-blocking film 13 and the color filter CF (the red filter 14, the green filter 15, the blue filter 16) is greater than an entry angle θ2' in the case where the high refractive index film 18 is not provided. If the entry angle θ1' with respect to the interface between the inter-pixel light-blocking film 13 and the color filter CF (the red filter 14, the green filter 15, the blue filter 16) is greater than a predetermined angle, the light is totally reflected. Because the high refractive index film 18 refracts the light to make the entry angle θ1' greater, more light is totally reflected at the interface. As a result, the light having obliquely entered the pixel PX is hindered from entering any adjacent pixel, and it is thus possible to reduce color mixture between the pixels PX.

Figure 5:
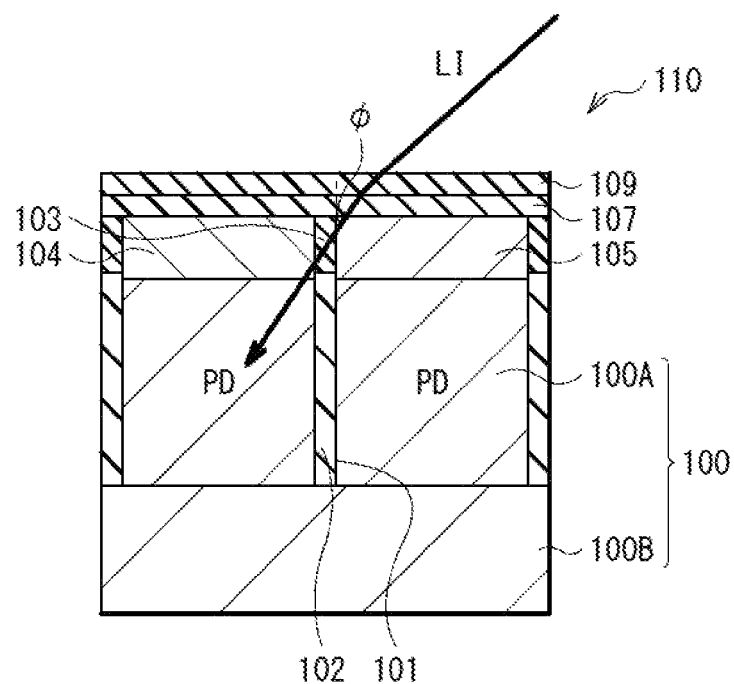
FIG. 5 is a diagram illustrating an example of a cross-sectional configuration of an imaging device according to a reference form.

The foregoing workings and effects will be described using a reference form. FIG. 5 illustrates a cross-sectional configuration of an imaging device 110 of the reference form, and illustrates a traveling path of light when the light obliquely enters the pixel PX. In the imaging device 110, the photodiode PD is formed in a semiconductor substrate 100 including an n-type semiconductor region 100A and a p-type semiconductor region 100B. In the semiconductor substrate 100, a pixel separation groove 101 is formed in the pixel separation region, and a pixel separation film 102 is formed to fill the pixel separation groove 101. In the semiconductor substrate 100, an inter-pixel light-blocking film 103 is formed in the inter-pixel light-blocking region, and color filters CF (a red filter 104, a green filter 105, a blue filter) are formed to be separated by the inter-pixel light-blocking film 103. A low refractive index film 107 is formed as an upper layer of the inter-pixel light-blocking film 103 and the color filters CF (the red filter 104, the green filter 105, the blue filter), and an antireflection film 109 is formed as an upper layer thereof. In the imaging device 110, no high refractive index film is provided as the upper layer of the color filters CF (the red filter 104, the green filter 105, the blue filter), and therefore the traveling path of the light LI is hardly changed even if the light LI obliquely enters the pixel PX. Accordingly, an angle φ at which the light LI enters the interface between the inter-pixel light-blocking film 103 and the color filter CF (the red filter 104, the green filter 105, the blue filter) (the angle at which the light LI enters the wall side of the color filter CF) is large, and therefore the light LI often enters an adjacent pixel without being totally reflected at the interface described above. As a result, color mixture between the pixels PX occurs easily.

Figure 6:
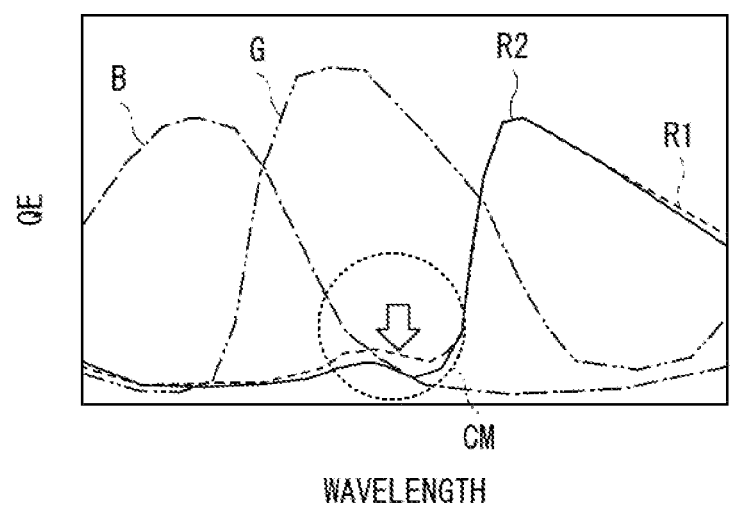
FIG. 6 is a plot illustrating a characteristic of a pixel of the imaging device of FIG. 1A.

FIG. 6 is a plot illustrating characteristics of the pixels of the imaging device 1 of FIG. 1 and the pixels of the imaging device 110 of FIG. 5. In the figure, the vertical axis represents quantum efficiency (QE), and the horizontal axis represents wavelength. Quantum efficiency R1 of the red pixel, quantum efficiency G of the green pixel, and quantum efficiency B of the blue pixel when light of respective wavelengths enter the imaging device 1 are illustrated. Further, quantum efficiency R2 of the red pixel when light of the respective wavelengths enters the imaging device 110 is also illustrated in an overlapping manner. The quantum efficiency of each of the green pixel and the blue pixel in the imaging device 110 is similar to that in the imaging device 1. Comparing the quantum efficiency R1 and the quantum efficiency R2, there is a difference that the quantum efficiency R2 is higher than the quantum efficiency R1 in the green wavelength region. The difference between the quantum efficiency R1 and the quantum efficiency R2 in the green wavelength region represents the magnitude of color mixture CM. That is, the imaging device 1 is able to suppress color mixture between the pixels PX better than the imaging device 110.

In the imaging device 1, the width W13 of the inter-pixel light-blocking film 13 between two adjacent color filters CF (the red filter 14, the green filter 15, and the blue filter 16) is preferably greater than or equal to the width W12 of the pixel separation film between two adjacent pixels PX. This makes it possible to obtain the effect of suppressing color mixture between the pixels PX described above even if misalignment occurs in the position of the color filters CF (the red filter 14, the green filter 15, and the blue filter 16) (the position of the recessed parts 13B for the color filter provided in the inter-pixel light-blocking film 13) with respect to the photodiodes PD.

It is preferable that the refractive index $n_{CF}$ of the color filters CF (the red filter 14, the green filter 15, and the blue filter 16) satisfy $1 < n_{13} \leq 1.5$ (the refractive index for light having a wavelength of 530 nm). Further, it is preferable that the refractive index $n_{18}$ of the high refractive index film 18 satisfy $1.5 < n_{18} \leq 4.2$ (the refractive index for light having a wavelength of 530 nm). In a case where the wavelength region of light targeted for reception by the imaging device 1 is the visible region (for example, greater than or equal to 400 nm and less than or equal to 700 nm), the wavelength of 530 nm is selected as a wavelength representing the visible region, and the refractive index at the wavelength of 530 nm is used as one reference. The magnitude relationship of the refractive index at the wavelength of 530 nm is based on a fact that a similar magnitude relationship is typically established also in the entire wavelength region greater than or equal to 400 nm and less than or equal to 700 nm. Using the refractive index at the wavelength of 530 nm as a reference is one example, and a refractive index at any other wavelength may be used as a reference. For example, in a case where the wavelength region of the light targeted for reception by the imaging device 1 is the infrared region (for example, 650 nm or greater), a material may be selected on the basis of a refractive index at a predetermined wavelength in the infrared region.

In the imaging device 1, it is preferable that the high refractive index film 18 have a film thickness less than or equal to the film thickness of the color filters CF (the red filter 14, the green filter 15, and the blue filter 16). In a case where the film thickness of the high refractive index film 18 is sufficiently great, even if light is refracted in a direction more perpendicular to the principal surface of the semiconductor substrate 10 when entering the high refractive index film 18, the light returns to the original direction when exiting the high refractive index film 18. This makes it difficult to obtain the above-described effect of suppressing color mixture. If the film thickness of the high refractive index film 18 is about the film thickness of the color filters CF (the red filter 14, the green filter 15, and the blue filter 16) or less, it is possible to prevent the light from returning to the original direction when the light exits the high refractive index film 18. As a result, it is possible to obtain the above-described effect of suppressing color mixture between the pixels PX.

As described above, in the imaging device 1 of the present embodiment, entering light is refracted by the high refractive index film 18, and therefore more light is totally reflected at the interface between the inter-pixel light-blocking film 103 and the color filter CF (the red filter 14, the green filter 15, the blue filter 16). As a result, light having obliquely entered the pixel PX is hindered from entering any adjacent pixel, and it is thus possible to reduce color mixture between the pixels PX.

<2. Modification Examples>

Modification examples of the imaging device 1 according to the foregoing embodiment are described below. In the following modification examples, components common to those in the foregoing embodiment are denoted by the same reference signs.

[Modification Example A]

The foregoing imaging device 1 has a configuration in which each pixel PX is provided with the color filter CF (the red filter 14, the green filter 15, the blue filter 16); however, the present disclosure is not limited thereto, and a transparent film 20 may be formed in place of the color filter CF.

FIG. 7A illustrates an example of a planar configuration of an imaging device 1A as Modification Example A. FIG. 7B illustrates an example of a cross-sectional configuration of the imaging device of FIG. 7A taken along II-II'. In the imaging device 1A, the transparent films 20 are provided in place of the color filters CF in all the pixels PX. Except for the above, the imaging device 1A has a configuration similar to that of the imaging device 1.

The imaging device 1A captures monochrome images. A wavelength region targeted for imaging by the imaging device 1A is, for example, the visible region, the infrared region, or the ultraviolet region. The transparent film 20 includes a material that transmits light in the wavelength region targeted for imaging. For example, the transparent film 20 may be a film having a characteristic of adjusting a transmittance in the entire wavelength region targeted for imaging, such as an ND (Natural Density) gray filter.

In the imaging device 1A, the transparent film 20 has a refractive index $n_{20}$ higher than that of the inter-pixel light-blocking film 13 and lower than that of the high refractive index film 18. As a result, in a case where the light LI obliquely enters the pixel PX, the high refractive index film 18 refracts the light LI, thereby allowing more light to be totally reflected at the interface between the inter-pixel light-blocking film 13 and the transparent film 20. Consequently, the light having obliquely entered the pixel PX is hindered from entering any adjacent pixel, and it is thus possible to reduce color mixture between the pixels PX.

[Modification Example B]

The foregoing imaging device 1 has a configuration in which the width W13 of the inter-pixel light-blocking film 13 is greater than the width W12 of the pixel separation film; however, the present disclosure is not limited thereto, and a configuration is possible in which the width W13 of the inter-pixel light-blocking film 13 is substantially equal to the width W12 of the pixel separation film.

FIG. 8A illustrates an example of a planar configuration of an imaging device 1B as Modification Example B. FIG. 8B illustrates an example of a cross-sectional configuration of the imaging device of FIG. 8A taken along III-III'. In the imaging device 1B, the width W13 of the inter-pixel light-blocking film 13 is substantially equal to the width W12 of the pixel separation film. Except for the above, the imaging device 1B has a configuration similar to that of the imaging device 1.

In the imaging device 1B, similarly to the above, in the case where the light LI obliquely enters the pixel PX, the high refractive index film 18 refracts the light LI, thereby allowing more light to be totally reflected at the interface between the inter-pixel light-blocking film 13 and the color filter CF (the red filter 14, the green filter 15, the blue filter 16). As a result, the light having obliquely entered the pixel PX is hindered from entering any adjacent pixel, and it is thus possible to reduce color mixture between the pixels PX.

[Modification Example C]

The foregoing imaging device 1 has a configuration in which the inter-pixel light-blocking film 13 is formed in the inter-pixel light-blocking region; however, the present disclosure is not limited thereto, and air may be used to form an inter-pixel light-blocking section 13C instead of the inter-pixel light-blocking film 13. That is, in the inter-pixel light-blocking section 13C, an end face 14A of the red filter 14 is in contact with the air. The end face 14A is a surface of the red filter 14 on side of the inter-pixel light-blocking section 13C. An end face 15A of the green filter 15 and an end face (not illustrated) of the blue filter 16 are also in contact with the air similarly.

FIG. 9A illustrates an example of a planar configuration of an imaging device 1C as Modification Example C. FIG. 9B illustrates an example of a cross-sectional configuration of the imaging device of FIG. 9A taken along IV-IV'. In the imaging device 1C, the inter-pixel light-blocking film 13 is not formed in the inter-pixel light-blocking region but the inter-pixel light-blocking section 13C using air is formed. Further, the inter-pixel light-blocking section 13C has a width W13C substantially equal to the width W12 of the pixel separation film. Further, the low refractive index film 17 is not provided. Except for the above, the imaging device 1C has a configuration similar to that of the imaging device 1.

In the imaging device 1C, similarly to the above, in the case where the light LI obliquely enters the pixel PX, the high refractive index film 18 refracts the light LI, thereby allowing more light to be totally reflected at the interface between the inter-pixel light-blocking section 13C (air) and the color filter CF (the red filter 14, the green filter 15, the blue filter 16). As a result, the light having obliquely entered the pixel PX is hindered from entering any adjacent pixel, and it is thus possible to reduce color mixture between the pixels PX. The inter-pixel light-blocking section 13C (air) has a refractive index of 1.0, and it is thus possible to secure a large difference from the color filter CF (the red filter 14, the green filter 15, the blue filter 16) in refractive index. This allows even more light to be totally reflected at the interface between the inter-pixel light-blocking section 13C (air) and the color filter CF (the red filter 14, the green filter 15, the blue filter 16).

[Modification Example D]

In the foregoing imaging device 1C, the top surfaces of the color filters CF (the red filter 14, the green filter 15, the blue filter 16) and the top surface of the high refractive index film 18 are flat surfaces; however, the present disclosure is not limited thereto, and end parts of their top surfaces may have a tapered shape.

FIG. 10 illustrates an example of a cross-sectional configuration of an imaging device 1D as Modification Example D. In the imaging device 1D, the top surface of the color filter CF (the red filter 14, the green filter 15, the blue filter 16) is flat, and an end part 18C of the top surface of the high refractive index film 18 has a tapered shape. A top surface of the antireflection film 19 has an end part that is in a tapered shape along the shape of the high refractive index film 18. Owing to the end part 18C of the top surface of the high refractive index film 18 having a tapered shape, it is possible to increase the efficiency of light condensing onto the photodiode PD. The end part 18C of the top surface of the color filter CF (the red filter 14, the green filter 15, the blue filter 16) may have a tapered shape, and the top surfaces of the high refractive index film 18 and the antireflection film 19 may have end parts that are in a tapered shape along the shape of the color filter CF (the red filter 14, the green filter 15, the blue filter 16). Except for the above, the imaging device 1D has a configuration similar to that of the imaging device 1C. The tapered shape described above may be a tapered shape that is intentionally obtained by an etching process or the like, or may be a tapered shape that results from forming and processing the color filter CF or the high refractive index film 18 during their formation and processing.

In the imaging device 1D, similarly to the above, in the case where the light LI obliquely enters the pixel PX, the high refractive index film 18 refracts the light LI, thereby allowing more light to be totally reflected at the interface between the inter-pixel light-blocking section 13C (air) and the color filter CF (the red filter 14, the green filter 15, the blue filter 16).

As a result, the light having obliquely entered the pixel PX is hindered from entering any adjacent pixel, and it is thus possible to reduce color mixture between the pixels PX. The refractive index of the inter-pixel light-blocking portion 13C (air) is 1.0, and it is thus possible to secure a large difference from the color filter CF (the red filter 14, the green filter 15, the blue filter 16) in refractive index. This allows even more light to be totally reflected at the interface between the inter-pixel light-blocking section 13C (air) and the color filter CF (the red filter 14, the green filter 15, the blue filter 16). Furthermore, owing to the end part of the high refractive index film 18 having a tapered shape, it is possible to condense yet more light onto the photodiode PD of each pixel PX.

[Modification Example E]

The above imaging device 1C has a configuration in which the inter-pixel light-blocking portion 13C is configured using air; however, the present disclosure is not limited thereto, and the inter-pixel light-blocking region may be filled with a material having a lower refractive index.

FIG. 11A illustrates an example of a planar configuration of an imaging device 1E as Modification Example E. FIG. 11B illustrates an example of a cross-sectional configuration of the imaging device of FIG. 11A taken along V-V'. In the imaging device 1E, the inter-pixel light-blocking film 13 is formed in the inter-pixel light-blocking region using the same material as the antireflection film 19. The inter-pixel light-blocking film 13 and the antireflection film 19 are integral with each other to configure a low refractive index film 30. Except for the above, the imaging device 1E has a configuration similar to that of the imaging device 1C.

In the imaging device 1E, similarly to the above, in the case where the light LI obliquely enters the pixel PX, the high refractive index film 18 refracts the light LI, thereby allowing more light to be totally reflected at the interface between the inter-pixel light-blocking film 13 and the color filter CF (the red filter 14, the green filter 15, the blue filter 16). As a result, the light having obliquely entered the pixel PX is hindered from entering any adjacent pixel, and it is thus possible to reduce color mixture between the pixels PX.

[Modification Example F]

The foregoing imaging device 1C has a configuration in which each pixel PX is provided with the color filter CF (the red filter 14, the green filter 15, the blue filter 16); however, the present disclosure is not limited thereto, and the transparent film 20 may be formed in place of the color filter CF.

FIG. 12A illustrates an example of a planar configuration of an imaging device 1F as Modification Example F. FIG. 12B illustrates an example of a cross-sectional configuration of the imaging device of FIG. 12A taken along VI-VI'. In the imaging device 1F, the transparent films 20 are provided in place of the color filters CF in all the pixels PX. Except for the above, the imaging device 1F has a configuration similar to that of the imaging device 1C.

The imaging device 1F captures monochrome images. A wavelength region targeted for imaging by the imaging device 1F is, for example, the visible region, the infrared region, or the ultraviolet region. The transparent film 20 includes a material that transmits light in the wavelength region targeted for imaging. In the imaging device 1F, the refractive index $n_{20}$ of the transparent film 20 is higher than that of the inter-pixel light-blocking section 13C (air) and lower than that of the high refractive index film 18. As a result, in the case where the light LI obliquely enters the pixel PX, the high refractive index film 18 refracts the light LI, thereby allowing more light to be totally reflected at the interface between the inter-pixel light-blocking section 13C and the transparent film 20. Consequently, the light having obliquely entered the pixel PX is hindered from entering any adjacent pixel, and it is thus possible to reduce color mixture between the pixels PX.

[Modification Example G]

The foregoing imaging device 1C has a configuration in which one color filter CF (the red filter 14, the green filter 15, the blue filter 16) is provided for one photodiode PD constituting one pixel; however, the present disclosure is not limited thereto, and one color filter CF (the red filter 14, the green filter 15, the blue filter 16) may be provided for a plurality of sub-pixels (photodiodes PD). For one sub-pixel, one photodiode PD is provided.

FIG. 13A illustrates an example of a planar configuration of an imaging device 1G as Modification Example G. FIG. 13B illustrates an example of a cross-sectional configuration of the imaging device of FIG. 13A taken along VII-VII'. In the imaging device 1G, one color filter CF (the red filter 14, the green filter 15, the blue filter 16) is provided for four sub-pixels (photodiodes PD) arranged in two rows and two columns in each pixel PX. That is, a red pixel PX1 has one red filter 14, the red filter 14 being provided as a common filter for the sub-pixels (a photodiode PD11, a photodiode PD12, a photodiode PD13, and a photodiode PD14) arranged in two rows and two columns. A green pixel PX2 has one green filter 15, the green filter 15 being provided as a common filter for the sub-pixels (a photodiode PD21, a photodiode PD22, a photodiode PD23, and a photodiode PD24) arranged in two rows and two columns. A blue pixel PX3 has one blue filter 16, the blue filter 16 being provided as a common filter for the sub-pixels (a photodiode PD31, a photodiode PD32, a photodiode PD33, and a photodiode PD34) arranged in two rows and two columns. The four sub-pixels constituting the red pixel PX1 (the photodiode PD11, the photodiode PD12, the photodiode PD13, and the photodiode PD14) are separated from each other by a sub-pixel separation film 12A provided inside the semiconductor substrate 10. The four sub-pixels constituting the green pixel PX2 (the photodiode PD21, the photodiode PD22, the photodiode PD23, and the photodiode PD24) are also similarly separated from each other by the sub-pixel separation film 12A. The four sub-pixels constituting the blue pixel PX3 (the photodiode PD31, the photodiode PD32, the photodiode PD33, and the photodiode PD34) are also similarly separated from each other by the sub-pixel separation film 12A. The sub-pixel separation film 12A is provided in a manner similar to the pixel separation film 12. That is, the sub-pixel separation film 12A is formed by filling, with silicon oxide or the like, a sub-pixel separation groove 11A formed in the semiconductor substrate 10 at a sub-pixel separation region. Except for the above, the imaging device 1G has a configuration similar to that of the imaging device 1C.

The red pixel PX1, the green pixel PX2, and the blue pixel PX3 of the imaging device 1G are phase difference detection pixels. For example, FIG. 13B illustrates that in the green pixel PX2, two pieces of light LT1 and LT2 that enter the green pixel PX2 in different directions are respectively received by the photodiodes PD21 and PD22 different from each other. In other words, in one green pixel PX2, the photodiode PD21, the photodiode PD22, the photodiode PD23, and the photodiode PD24 receive pieces of light entering in different directions. An image-plane phase difference is detected by, for example, acquiring output differences from respective signals outputted from the photodiode PD11, the photodiode PD12, the photodiode PD13, and the photodiode PD14. The obtained phase difference is applicable to focus detection or the like of a subject. It is possible to detect the image-plane phase difference also for the red pixel PX1 and the blue pixel PX3 in a similar manner. For example, some of effective pixels provided on the light receiving surface of the imaging device 1G are configured to be the phase difference detection pixels including the red pixel PX1, the green pixel PX2, and the blue pixel PX3. Alternatively, all of the effective pixels may be the phase difference detection pixels.

As illustrated in FIG. 13B, in the imaging device 1G, in a case where light LI1 obliquely enters the green pixel PX2, the light LI1 is refracted by the high refractive index film 18 and totally reflected at an interface between the inter-pixel light-blocking section 13C (air) and the color filter CF (the green filter 15) to enter the photodiode PD21. Light LI2 is also similarly refracted by the high refractive index film 18 and totally reflected at the interface between the inter-pixel light-blocking section 13C (air) and the color filter CF (the green filter 15) to enter the photodiode PD22. Owing to the total reflection at the interface between the inter-pixel light-blocking section 13C (air) and the color filter CF (the green filter 15), the light having obliquely entered the green pixel PX2 is hindered from entering any adjacent pixel. Regarding also the red pixel PX1 and the blue pixel PX3, light is similarly hindered from entering any adjacent pixel. Accordingly, it is possible to reduce color mixture between the red pixel PX1, the green pixel PX2, and the blue pixel PX3.

In addition, no on-chip lens is provided in the imaging device 1G. In an imaging device with an on-chip lens, any misalignment of the on-chip lens with the pixel PX can increase a sensitivity difference between sub-pixels constituting the same pixel (the red pixel PX1, the green pixel PX2, the blue pixel PX3). One reason for this is that a misalignment of the on-chip lens results in an increase in light entering one of the sub-pixels in one pixel and a decrease in light entering another sub-pixel in the same pixel. The imaging device 1G is not provided with an on-chip lens but provided with the high refractive index film 18. Even if any misalignment occurs in the high refractive index film 18, no increase occurs in the sensitivity difference between the sub-pixels in contrast to a case where a misalignment occurs in the on-chip lens, and therefore an influence on the sensitivity difference between the sub-pixels is small. Further, with a configuration having the on-chip lens, light condensed by the on-chip lens sometimes impinges on the vicinity of a top end of the sub-pixel separation film 12A to scatter in each pixel (the red pixel PX1, the green pixel PX2, the blue pixel PX3), causing color mixture or the like. In the imaging device 1G, no condensed light impinges on the vicinity of the top end of the sub-pixel separation film 12A to scatter, and therefore it is possible to suppress color mixture.

[Modification Example H]

In the foregoing imaging device 1G, the top surface of the color filter CF (the red filter 14, the green filter 15, the blue filter 16) and the top surface of the high refractive index film 18 are flat surfaces; however, the present disclosure is not limited thereto, and end parts of their top surfaces may have a tapered shape.

FIG. 14 illustrates an example of a cross-sectional configuration of an imaging device 1H as Modification Example H. The imaging device 1H includes a phase difference detection pixel. In the imaging device 1H, the top surface of the color filter CF (the red filter 14, the green filter 15, the blue filter 16) is flat, and the end part 18C of the top surface of the high refractive index film 18 has a tapered shape. The top surface of the antireflection film 19 has the end part that is in a tapered shape along the shape of the high refractive index film 18. Owing to the end part 18C of the top surface of the high refractive index film 18 having a tapered shape, it is possible to increase the efficiency of light condensing onto the photodiodes PD11, PD12, PD21, and PD22. The end part 18C of the top surface of the color filter CF (the red filter 14, the green filter 15, the blue filter 16) may have a tapered shape, and the top surfaces of the high refractive index film 18 and the antireflection film 19 may have end parts that are in a tapered shape along the shape of the color filter CF (the red filter 14, the green filter 15, the blue filter 16). Except for the above, the imaging device 1H has a configuration similar to that of the imaging device 1G. The tapered shape described above may be a tapered shape that is intentionally obtained by an etching process or the like, or may be a tapered shape that results from forming and processing the color filter CF or the high refractive index film 18 during their formation and processing.

In the imaging device 1H, similarly to the above, in the case where the light LI obliquely enters a pixel (the red pixel PX1, the green pixel PX2), the high refractive index film 18 refracts the light LI, thereby allowing more light to be totally reflected at the interface between the inter-pixel light-blocking section 13C (air) and the color filter CF (the red filter 14, the green filter 15, the blue filter 16). As a result, the light having obliquely entered the pixel (the red pixel PX1, the green pixel PX2) is hindered from entering any adjacent pixel, and it is thus possible to reduce color mixture between the pixels (the red pixel PX1, the green pixel PX2). Furthermore, owing to the top surface of the high refractive index film 18 having tapered end parts, it is possible to condense more light onto the photodiodes PD11, PD12, PD21, and PD22 of each pixel (the red pixel PX1, the green pixel PX2). Although not illustrated, the same applies to the blue pixel.

Regarding the phase difference detection pixel of the imaging device 1H or the like, it is desired to suppress the sensitivity difference between the photodiodes constituting the pixel and to increase a separation ratio between the photodiodes constituting the pixel. However, suppressing the sensitivity difference between the photodiodes and increasing the separation ratio have a trade-off relationship, and therefore, it is difficult to improve one of them without deteriorating the other, or to improve both of them. In the imaging device 1H, owing to the end part 18C of the top surface of the high refractive index film 18 having a tapered shape, it is possible to condense more light to increase the quantum efficiency with which the light enters the pixel. Accordingly, it is possible to secure the separation ratio while suppressing the sensitivity difference between the photodiodes.

[Modification Example I]

In the foregoing imaging device 1G, the position of the sub-pixel separation film 12A (the position of pupil division) in the pixel (the red pixel PX1, the green pixel PX2, and the blue pixel PX3) may be changed gradually from a middle part to a peripheral part of a light receiving surface 10C.

FIG. 15A illustrates an example of a planar configuration of an imaging device 1I as Modification Example I. The imaging device 1I includes a phase difference detection pixel. For example, as pixels (the red pixel PX1, the green pixel PX2, and the blue pixel PX3), a pixel PX-A is disposed at the middle part of the light receiving surface 10C, and a pixel PX-G is disposed at a corner part which is endmost in the light receiving surface 10C. At intermediate positions between the middle part and the end of the light receiving surface 10C, pixels PX-B, PX-C, PC-D, PX-E, and PX-F are disposed. Other pixels (not illustrated) may be disposed. At each of the pixels PX-A, PX-B, PX-C, PC-D, PX-E, PX-F, and PX-G, a pupil correction amount (IH) is set. The pupil correction amount is 0% for the pixel PX-A at the middle part of the light receiving surface 10C, and 100% for the pixel PX-G at the end (the corner part) of the light receiving surface 10C. Intermediate pupil correction amounts are set for the pixels PX-B, PX-C, PC-D, PX-E, and PX-F disposed at the intermediate positions. For example, the IH is 50% for the pixel PX-E between the pixel PX-A (IH of 0%) and the pixel PX-G (IH of 100%). Further, for the pixels PX-B and PX-C that are disposed in a vertical direction (an up-and-down direction in the drawing) as viewed from the pixel PX-A, the IHs are 30% and 60%, respectively, and the pupil correction amount thus increases with increasing proximity to the end (i.e., with increasing distance from the middle part) of the light receiving surface 10C. For the pixels PX-D and PX-F that are disposed in a horizontal direction (a right-and-left direction in the drawing) as viewed from the pixel PX-A, the IHs are 40% and 80%, respectively, and the pupil correction amount thus increases with increasing proximity to the end (i.e., with increasing distance from the middle part) of the light receiving surface 10C. The degree of the pupil correction amount differs between the vertical direction and the horizontal direction, and a larger pupil correction amount is set for the horizontal direction. However, the same pupil correction amount may be set for both directions, or a larger pupil correction amount may be set for the vertical direction.

FIG. 15B enlarges a main part of FIG. 15A. For example, the pixel PX-A at the middle part of the light receiving surface 10C includes a first photodiode PD1, a second photodiode PD2, a third photodiode PD3, and a fourth photodiode PD4. The four photodiodes PD1, PD2, PD3, and PD4 are separated from each other by the sub-pixel separation film 12A. Areas of the four photodiodes PD1, PD2, PD3, and PD4 are substantially equal in the pixel PX-A having a pupil correction amount of 0%.

In contrast, in the pixel PX-G at the end (the corner part) of the light-receiving surface 10C, the position of the sub-pixel separation film 12A is so adjusted as to approach the end of the light-receiving surface 10C in both of the vertical direction and the horizontal direction. That is, in the pixel PX-G, the photodiode PD1 closer to the middle part in the vertical and horizontal directions has a large area, the photodiode PD4 closer to the end in the vertical and horizontal directions has a small area, and the photodiodes PD2 and PD3 each have an area intermediate therebetween. The pixel PX-G is a pixel in which the pupil correction amount is 100%, and the correction amount is adjusted to be the largest.

In the pixels PX-B, PX-C, PC-D, PX-E, and PX-F disposed at intermediate positions between the middle part and the end (the corner part) of the light receiving surface 10C, the respective positions of the sub-pixel separation films in the pixels PX-B, PX-C, PC-D, PX-E, and PX-F are adjusted in accordance with the respective pupil correction amounts illustrated in FIG. 15B. In such a manner, the areas of the photodiodes PD1, PD2, PD3, and PD4 constituting each of the pixels PX-B, PX-C, PC-D, PX-E, and PX-F are provided to change gradually from the middle part to the end (the corner part) of the light receiving surface 10C.

The imaging device 1I includes a phase difference detection pixel. While the phase difference detection pixel includes four photodiodes PD1, PD2, PD3, and PD4, their sensitivities vary depending on the position in the light receiving surface 10C. That is, the closer the pixel to the end (the corner part) of the light receiving surface 10C, the higher the sensitivity of any of the photodiodes PD1, PD2, PD3, and PD4 closer to the end (the corner part). One reason for this is that, as the pixel is closer to the end (the corner part), paths for light to enter ones of the four photodiodes PD1, PD2, PD3, and PD4 closer to the middle part decreases, whereas paths for light to enter ones of the photodiodes closer to the end (the corner part) increases. Accordingly, the sensitivity difference between the four photodiodes PD1, PD2, PD3, and PD4 increases. In the imaging device 1I, the pupil correction amounts are set to cause the areas of the photodiodes PD1, PD2, PD3, and PD4 constituting each pixel to change gradually from the middle part to the end (the corner part) of the light receiving surface 10C. This makes it possible to reduce the sensitivity difference between the photodiodes in the pixel occurring depending on the position in the light receiving surface 10C, and to thereby uniformize the sensitivity.

In the imaging device 1I, similarly to the above, in the case where the light LI obliquely enters any of the pixels PX-A to PX-G, the high refractive index film 18 refracts the light LI, thereby allowing more light to be totally reflected at the interface between the inter-pixel light-blocking section 13C (air) and the color filter CF (the red filter 14, the green filter 15, the blue filter 16). As a result, the light having obliquely entered any of the pixels PX-A to PX-G is hindered from entering any adjacent pixel, and it is thus possible to reduce color mixture between the pixels PX-A to PX-G. Furthermore, owing to the pupil correction amounts being set to cause the areas of the photodiodes PD1, PD2, PD3, and PD4 constituting each of the pixels PX-A to PX-G to change gradually from the middle part to the end (the corner part) of the light receiving surface 10C, it is possible to reduce the sensitivity difference between the photodiodes in the pixel and to thereby uniformize the sensitivity.

[Modification Example J]

In the foregoing imaging device 1G, each sub-pixel (photodiode) has a substantially square shape in a plan view; however, the present disclosure is not limited thereto, and each sub-pixel may have a rectangular shape in a plan view.

FIG. 16A illustrates an example of a planar configuration of an imaging device 1J as Modification Example J. FIG. 16B illustrates an example of a cross-sectional configuration of the imaging device of FIG. 16A taken along VIII-VIII'. In the imaging device 1J, the red pixel PX1 has one red filter 14, the red filter 14 being provided as a common filter for sub-pixels (a photodiode PD11 and a photodiode PD12) each having a rectangular shape. The red pixel PX1 with the photodiode PD11 and the photodiode PD12 combined with each other has a substantially square shape in a plan view. The same applies to the green pixel PX2 and the blue pixel PX3.

In the imaging device 1J, similarly to the above, in the case where the light LI obliquely enters a pixel (the red pixel PX1, the green pixel PX2, the blue pixel PX3), the high refractive index film 18 refracts the light LI, thereby allowing more light to be totally reflected at the interface between the inter-pixel light-blocking section 13C (air) and the color filter CF (the red filter 14, the green filter 15, the blue filter 16). As a result, the light having obliquely entered the pixel (the red pixel PX1, the green pixel PX2, the blue pixel PX3) is hindered from entering any adjacent pixel, and it is thus possible to reduce color mixture between the pixels (the red pixel PX1, the green pixel PX2, the blue pixel PX3).

[Modification Example K]

In the foregoing imaging device 1G, each sub-pixel (photodiode) has a substantially square shape in a plan view; however, the present disclosure is not limited thereto, and each sub-pixel may have a rectangular shape in a plan view.

FIG. 17A illustrates an example of a planar configuration of an imaging device 1K as Modification Example K. FIG. 17B illustrates an example of a cross-sectional configuration of the imaging device of FIG. 17A taken along IX-IX'. In the imaging device 1K, the red pixel PX1 has one red filter 14, the red filter 14 being provided as a common filter for sub-pixels (photodiodes PD11, PD12, PD13, PD14, PD15, PD16, PD17, and PD18) arranged in two rows and four columns, each having a rectangular shape. The entire red pixel PX1 with the photodiodes PD11 to PD18 has a substantially square shape in a plan view. The same applies to the green pixel PX2 and the blue pixel PX3.

In the imaging device 1K, similarly to the above, in the case where the light LI obliquely enters a pixel (the red pixel PX1, the green pixel PX2, the blue pixel PX3), the high refractive index film 18 refracts the light LI, thereby allowing more light to be totally reflected at the interface between the inter-pixel light-blocking section 13C (air) and the color filter CF (the red filter 14, the green filter 15, the blue filter 16). As a result, the light having obliquely entered the pixel (the red pixel PX1, the green pixel PX2, the blue pixel PX3) is hindered from entering any adjacent pixel, and it is thus possible to reduce color mixture between the pixels (the red pixel PX1, the green pixel PX2, the blue pixel PX3).

[Modification Example L]

In the foregoing imaging device 1G, one color filter CF (the red filter 14, the green filter 15, the blue filter 16) is provided for four sub-pixels (photodiodes); however, the present disclosure is not limited thereto, and one color filter CF (the red filter 14, the green filter 15, the blue filter 16) may be configured to be provided for two sub-pixels (photodiodes).

FIG. 18A illustrates an example of a planar configuration of an imaging device 1L as Modification Example L. FIG. 18B illustrates an example of a cross-sectional configuration of the imaging device of FIG. 18A taken along X-X'. In the imaging device 1L, the green pixel PX2 has one green filter 15, the green filter 15 being provided as a common filter for two sub-pixels (photodiodes PD21 and PD22) each having a substantially square shape.

In the imaging device 1L, similarly to the above, in the case where the light LI obliquely enters the green pixel PX2, the high refractive index film 18 refracts the light LI, thereby allowing more light to be totally reflected at the interface between the inter-pixel light-blocking section 13C (air) and the color filter CF (the green filter 15). As a result, the light having obliquely entered the green pixel PX2 is hindered from entering any adjacent pixel, and it is thus possible to reduce color mixture between the green pixel PX2 and any pixel adjacent thereto.

<3. Application Examples>

[Application Example 1]

Any of the foregoing imaging devices 1 and 1A to 1L (collectively referred to as imaging device 1) is applicable to, for example, various electronic apparatuses including cameras such as a digital still camera or a digital video camera, a mobile phone having an imaging function, and other apparatuses having imaging functions.

FIG. 19 is a block diagram illustrating an example of a schematic configuration of an electronic apparatus including the imaging device according to any of the foregoing embodiment and modification examples thereof.

The electronic apparatus 201 illustrated in FIG. 19 includes an optical system 202, a shutter device 203, the imaging device 1, a driving circuit 205, a signal processing circuit 206, a monitor 207, and a memory 208, and is able to capture a still image and a moving image.

The optical system 202 includes one or a plurality of lenses, and guides light (entering light) from a subject to the imaging device 1 to form an image on the light receiving surface of the imaging device 1.

The shutter device 203 is disposed between the optical system 202 and the imaging device 1, and controls, under the control of the driving circuit 205, a period during which the imaging device 1 is to be irradiated with the light and a period during which the light is to be blocked.

The imaging device 1 is configured by a package that includes the above-described imaging device. The imaging device 1 accumulates signal electric charges for a fixed period in accordance with light of which an image is formed on the light receiving surface through the optical system 202 and the shutter device 203. The signal electric charges accumulated in the imaging device 1 are transferred in accordance with a drive signal (a timing signal) supplied from the driving circuit 205.

The driving circuit 205 outputs a drive signal for controlling a transfer operation of the imaging device 1 and a shutter operation of the shutter device 203 to drive the imaging device 1 and the shutter device 203.

The signal processing circuit 206 performs various signal processing on signal electric charges outputted from the imaging device 1. An image (image data) obtained by performing the signal processing by the signal processing circuit 206 is supplied to and displayed on the monitor 207, or is supplied to and stored (recorded) in the memory 208.

In the electronic apparatus 201 configured as described above, applying the imaging device 1 makes it possible to achieve imaging with reduced color mixture between pixels.

[Application Example 2]

FIG. 20 illustrates an example of a schematic configuration of an imaging system 2 including any of the foregoing imaging devices 1 and 1A to 1L. In FIG. 20, the imaging device 1 is illustrated as a representative of the imaging devices 1 and 1A to 1L. Hereinafter, the imaging devices 1 and 1A to 1L will be collectively referred to as imaging device 1.

The imaging system 2 is, for example, any of electronic apparatuses including imaging devices such as a digital still camera or a video camera, and mobile terminal devices such as a smartphone or a tablet terminal. The imaging system 2 includes, for example, the imaging device 1 according to any of the foregoing embodiment and modification examples thereof, a DSP circuit 141, a frame memory 142, a display section 143, a storage section 144, an operation section 145, and a power supply section 146. In the imaging system 2, the imaging device 1 according to any of the foregoing embodiment and modification examples thereof, the DSP circuit 141, the frame memory 142, the display section 143, the storage section 144, the operation section 145, and the power supply section 146 are coupled to each other via a bus line 147.

The imaging device 1 according to any of the foregoing embodiment and modification examples thereof outputs image data corresponding to entering light. The DSP circuit 141 is a signal processing circuit that processes a signal (image data) outputted from the imaging device 1 according to any of the foregoing embodiment and modification examples 1 to W thereof. The frame memory 142 temporarily holds the image data processed by the DSP circuit 141 on a frame-by-frame basis. The display section 143 includes, for example, a display of a panel type such as a liquid crystal panel or an organic EL (Electro Luminescence) panel, and displays a moving image or a still image captured by the imaging device 1 according to any of the foregoing embodiment and modification examples thereof. The storage section 144 stores image data of the moving image or the still image captured by the imaging device 1 according to any of the foregoing embodiment and modification examples thereof in a storage medium such as a semiconductor memory or a hard disk. The operation section 145 outputs an operation command relating to various functions of the imaging system 2 in accordance with user's operations. The power supply section 146 appropriately supplies various kinds of power serving as operation power sources for the imaging device 1 according to any of the foregoing embodiment and modification examples thereof, the DSP circuit 141, the frame memory 142, the display section 143, the storage section 144, and the operation section 145, to these targets of supply.

Next, a description will be given of an imaging procedure by the imaging system 2.

FIG. 21 illustrates an example of a flowchart of the imaging operation by the imaging system 2. The user operates the operation section 145 to instruct to start imaging (step S101). The operation section 145 then transmits an imaging command to the imaging device 1 (step S102). Upon receiving the imaging command, the imaging device 1 (specifically, a system control circuit) performs imaging under a predetermined imaging scheme (step S103).

The imaging device 1 outputs image data obtained by imaging to the DSP circuit 141. As used herein, the image data refers to data of pixel signals for all pixels generated on the basis of electric charges temporarily held in a floating diffusion FD. The DSP circuit 141 performs predetermined signal processing (e.g., noise reduction processing, etc.) on the basis of the image data inputted from the imaging device 1 (step S104). The DSP circuit 141 causes the frame memory 142 to hold the image data having undergone the predetermined signal processing, and the frame memory 142 causes the storage section 144 to store the image data (step S105). In such a manner, imaging is performed by the imaging system 2.

In the present application example, the imaging device 1 according to any of the foregoing embodiment and modification examples A to L thereof is applied to the imaging system 2. This enables reduction in color mixture between the pixels of the imaging device 1, thus making it possible to provide the imaging system 2 with reduced color mixture between the pixels.

<4. Practical Application Examples>
[Practical Application Example 1]

The technology according to the present disclosure (the present technology) is applicable to various products. For example, the technology according to the present disclosure may be implemented as a device to be mounted on any type of mobile body such as an automobile, an electric vehicle, a hybrid electric vehicle, a motorcycle, a bicycle, a personal mobility, an airplane, a drone, a vessel, or a robot.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given above of one example of the mobile body control system, to which the technology according to the present disclosure is applicable. The technology according to the present disclosure is applicable to the imaging section 12031 of the configuration described above. Specifically, the imaging device 1 according to any of the foregoing embodiment and modification examples thereof is applicable to the imaging section 12031. Applying the technology according to the present disclosure to the imaging section 12031 makes it possible to obtain a high-definition captured image with reduced color mixture between pixels. It is thus possible to carry out a highly accurate control using the captured image in the mobile body control system.

[Practical Application Example 2]

FIG. 24 is a view depicting an example of a schematic configuration of an endoscopic surgery system to which the technology according to an embodiment of the present disclosure (present technology) can be applied.

In FIG. 24, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 25 is a block diagram depicting an example of a functional configuration of the camera head 11102 and the CCU 11201 depicted in FIG. 24.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to the present disclosure is applicable. The technology according to the present disclosure is suitably applicable to, for example, the image pickup unit 11402 provided in the camera head 11102 of the endoscope 11100, among the configurations described above. Applying the technology according the present disclosure to the image pickup unit 11402 enables miniaturization or higher definition of the image pickup unit 11402 by reducing color mixture between pixels, thus making it possible to provide the miniaturized or high-definition endoscope 11100 with reduced color mixture between pixels.

<5. Other Modification Examples>

While the present disclosure has been described above with reference to the embodiment, Modification Examples A to L thereof, the application examples, and the practical application examples thereof, the present disclosure is not limited to the foregoing embodiment and the like, and a variety of modifications may be made.

In the foregoing embodiment and the modification examples thereof, description has been given of the color imaging device of Bayer arrangement, the monochrome imaging device, and the color imaging device including the phase difference detection pixels. However, the present disclosure is not limited thereto, and is also applicable to an imaging device having any other color filter configuration instead of the above, or to an imaging device having any other light transmissive film instead of a color filter.

It is to be noted that the effects described herein are mere examples. The effects of the present disclosure are not limited to the effects described herein. The present disclosure may have any effect other than the effects described herein.

It is to be noted that the present technology may also have the following configurations. According to the present technology having the following configurations, it is possible to reduce color mixture between pixels.

(1) An imaging device including:
- a plurality of pixels each having a stacked structure in which a photoelectric conversion section including a light entrance surface, a first light transmissive film provided to face the light entrance surface and having a first refractive index, and a second light transmissive film having a second refractive index higher than the first refractive index are stacked in order in a stacking direction, the plurality of pixels being arranged in an in-plane direction orthogonal to the stacking direction; and
- a first pixel separation section provided between a plurality of the first light transmissive films adjacent to each other in the in-plane direction, the first pixel separation section having a third refractive index lower than the first refractive index.

(2)
The imaging device according to (1), in which the first pixel separation section includes a first pixel separation film having the third refractive index.

(3)
The imaging device according to (1), in which an end face of the first light transmissive film is in contact with air in the first pixel separation section.

(4)
The imaging device according to any one of (1) to (3), further including a second pixel separation section provided between a plurality of the photoelectric conversion sections adjacent to each other.

(5)
The imaging device according to (4), in which the second pixel separation section includes a second pixel separation film.

(6)
The imaging device according to (4) or (5), in which
the first pixel separation section between adjacent two of the first light transmissive films has a first width, and
the second pixel separation section between adjacent two of the pixels has a second width equivalent to or smaller than the first width.

(7)
The imaging device according to any one of (1) to (6), in which the first light transmissive film includes a color filter.

(8)
The imaging device according to (7), in which the color filter includes a red filter, a green filter, and a blue filter.

(9)
The imaging device according to any one of (1) to (8), in which the first refractive index is greater than 1.5 and less than or equal to 4.2 for light having a wavelength of 530 nm.

(10)
The imaging device according to any one of (1) to (9), in which the third refractive index is greater than 1 and less than or equal to 1.5 for light having a wavelength of 530 nm.

(11)
The imaging device according to any one of (1) to (10), further including a plurality of sub-pixel separation films, in which
the plurality of pixels each includes a plurality of sub-pixels separated from each other by the sub-pixel separation films.

(12)
The imaging device according to (11), in which, in one of the plurality of pixels, the plurality of sub-pixels is arranged in two rows and two columns.

(13)
The imaging device according to (11), in which each of the plurality of sub-pixels is formed in a region that has a rectangular shape in a plan view.

(14)
The imaging device according to (11), in which
each of the plurality of sub-pixels is formed in a region that has a rectangular shape in a plan view, and
in one of the plurality of pixels, the plurality of sub-pixels is arranged in two rows and four columns.

(15)
The imaging device according to (11), in which
each of the plurality of sub-pixels is formed in a region that has a substantially square shape in a plan view, and
one of the plurality of pixels includes adjacent two of the sub-pixels.

(16)
The imaging device according to (11), in which
the plurality of pixels is arranged in the in-plane direction to configure a light receiving surface,
one of the plurality of pixels includes a first sub-pixel and a second sub-pixel, and
an area of the first sub-pixel and an area of the second sub-pixel that are included in the pixel at a middle part of the light receiving surface are substantially equal, and the area of the first sub-pixel and the area of the second sub-pixel are configured to change gradually in such a manner that, as the pixel comes closer to an end of the light receiving surface away from the middle part, the area of one of the first sub-pixel and the second sub-pixel closer to the end becomes smaller, whereas the area of one of the first sub-pixel and the second sub-pixel closer to the middle part becomes greater.

(17)

The imaging device according to any one of (1) to (16), in which the first light transmissive film has a first film thickness, and the second light transmissive film has a second film thickness equivalent to or smaller than the first film thickness.

(18)

The imaging device according to any one of (1) to (17), in which an end part of the first light transmissive film or the second light transmissive film has a tapered shape.

(19)

An electronic apparatus including an optical system, an imaging device, and a signal processing circuit, in which the imaging device includes:

a plurality of pixels each having a stacked structure in which a photoelectric conversion section including a light entrance surface, a first light transmissive film provided to face the light entrance surface and having a first refractive index, and a second light transmissive film having a second refractive index higher than the first refractive index are stacked in order in a stacking direction, the plurality of pixels being arranged in an in-plane direction orthogonal to the stacking direction; and a first pixel separation section provided between a plurality of the first light transmissive films adjacent to each other in the in-plane direction, the first pixel separation section having a third refractive index lower than the first refractive index.

The present application claims priority from Japanese Patent Application No. 2019-15712 filed with the Japan Patent Office on Jan. 31, 2019, the entire content of which is incorporated herein by reference.

It should be understood that those skilled in the art would make various modifications, combinations, sub-combinations, and alterations depending on design requirements and other factors, and they are within the scope of the attached claims or the equivalents thereof.

What is claimed is:

1. An imaging device, comprising:
a plurality of pixels, wherein each pixel in the plurality of pixels includes:
   a photoelectric conversion section including a light entrance surface, and
   a first light transmissive film adjacent to the light entrance surface of the photoelectric conversion section, wherein the first light transmissive film has a first refractive index;
   a second light transmissive film adjacent a light incident surface side of the first light transmissive film, wherein the second light transmissive film is a planar film, wherein the second light transmissive film is a continuous film that extends across the first light transmissive films of the plurality of pixels, wherein the second light transmissive film has a second refractive index, and wherein the second refractive index is higher than the first refractive index; and
   a first pixel separation section, wherein the first pixel separation section extends between the first light transmissive films of adjacent pixels, wherein the first pixel separation section has a third refractive index, and wherein the third refractive index is lower than the first refractive index.

2. An electronic apparatus, comprising
an optical system,
an imaging device, and
a signal processing circuit, wherein
the imaging device includes:
   a plurality of pixels each having a stacked structure in which a photoelectric conversion section including a light entrance surface, a first light transmissive film provided to face the light entrance surface and having a first refractive index, and a second light transmissive film having a second refractive index higher than the first refractive index are stacked in order in a stacking direction, the plurality of pixels being arranged in an in-plane direction orthogonal to the stacking direction, wherein the second light transmissive film is a planar film, and wherein the second light transmissive film is a continuous film that extends across a light incident surface of a plurality of the first light transmissive films; and
   a first pixel separation section provided between a plurality of the first light transmissive films adjacent to each other in the in-plane direction, the first pixel separation section having a third refractive index lower than the first refractive index.

3. The imaging device according to claim 1, wherein the first pixel separation section includes a first pixel separation film having the third refractive index.

4. The imaging device according to claim 1, wherein an end face of the first light transmissive film is in contact with air in the first pixel separation section.

5. The imaging device according to claim 1, wherein the first refractive index is greater than 1.5 and less than or equal to 4.2 for light having a wavelength of 530 nm.

6. The imaging device according to claim 1, wherein the third refractive index is greater than 1 and less than or equal to 1.5 for light having a wavelength of 530 nm.

7. The imaging device according to claim 1, wherein
the first light transmissive film has a first film thickness, and
the second light transmissive film has a second film thickness equal to or smaller than the first film thickness.

8. The imaging device according to claim 1, wherein an end part of the first light transmissive film or the second light transmissive film has a tapered shape.

9. The imaging device according to claim 1, further comprising a second pixel separation section provided between a plurality of the photoelectric conversion sections adjacent to each other.

10. The imaging device according to claim 9, wherein the second pixel separation section comprises a second pixel separation film.

11. The imaging device according to claim 9, wherein
the first pixel separation section between adjacent two of the first light transmissive films has a first width, and
the second pixel separation section between adjacent two of the pixels has a second width equivalent to or smaller than the first width.

12. The imaging device according to claim 1, wherein the first light transmissive film comprises a color filter.

13. The imaging device according to claim 12, wherein the color filter includes a red filter, a green filter, and a blue filter.

14. The imaging device according to claim 1, further comprising a plurality of sub-pixel separation films, wherein
the plurality of pixels each includes a plurality of sub-pixels separated from each other by the sub-pixel separation films.

15. The imaging device according to claim 14, wherein, in one of the plurality of pixels, the plurality of sub-pixels is arranged in two rows and two columns.

16. The imaging device according to claim 14, wherein each of the plurality of sub-pixels is formed in a region that has a rectangular shape in a plan view.

17. The imaging device according to claim 14, wherein
each of the plurality of sub-pixels is formed in a region that has a rectangular shape in a plan view, and
in one of the plurality of pixels, the plurality of sub-pixels is arranged in two rows and four columns.

18. The imaging device according to claim 14, wherein
each of the plurality of sub-pixels is formed in a region that has a substantially square shape in a plan view, and
one of the plurality of pixels includes adjacent two of the sub-pixels.

19. The imaging device according to claim 14, wherein
the plurality of pixels is arranged in an in-plane direction to configure a light receiving surface,
one of the plurality of pixels includes a first sub-pixel and a second sub-pixel, and
an area of the first sub-pixel and an area of the second sub-pixel that are included in the pixel at a middle part of the light receiving surface are substantially equal, and the area of the first sub-pixel and the area of the second sub-pixel are configured to change gradually in such a manner that, as the pixel comes closer to an end of the light receiving surface away from the middle part, the area of one of the first sub-pixel and the second sub-pixel closer to the end becomes smaller, whereas the area of one of the first sub-pixel and the second sub-pixel closer to the middle part becomes greater.

* * * * *